(12) United States Patent
Lee et al.

(10) Patent No.: US 11,903,301 B2
(45) Date of Patent: Feb. 13, 2024

(54) DISPLAY PANEL WITH A SUBSTRATE HAVING CURVED SURFACES

(71) Applicant: SAMSUNG DISPLAY CO., LTD., Yongin-si (KR)

(72) Inventors: Younghoon Lee, Gwangmyeong-si (KR); Youngji Kim, Hwaseong-si (KR); Yiseul Um, Chungcheongnam-Do (KR); Wonje Jo, Ansan-si (KR); Young Seo Choi, Yongin-si (KR); Dongwon Han, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 22 days.

(21) Appl. No.: 17/455,491

(22) Filed: Nov. 18, 2021

(65) Prior Publication Data
US 2022/0077437 A1   Mar. 10, 2022

Related U.S. Application Data

(62) Division of application No. 16/855,645, filed on Apr. 22, 2020, now Pat. No. 11,205,769.

(30) Foreign Application Priority Data

Jun. 19, 2019 (KR) .................. 10-2019-0072694

(51) Int. Cl.
*H10K 71/00* (2023.01)
*H10K 50/844* (2023.01)
(Continued)

(52) U.S. Cl.
CPC .......... *H10K 71/00* (2023.02); *H10K 50/844* (2023.02); *H10K 59/12* (2023.02); *H10K 71/80* (2023.02); *H10K 71/851* (2023.02)

(58) Field of Classification Search
CPC ..................................................... H10K 71/00
(Continued)

(56) References Cited

U.S. PATENT DOCUMENTS 6,855,961 B2   2/2005   Maruyama et al.
8,721,389 B2   5/2014   Jung et al.
(Continued)

FOREIGN PATENT DOCUMENTS

EP   3657564       5/2020
JP   2003-28223    10/2003
(Continued)

OTHER PUBLICATIONS

Extended European Search Report dated Nov. 16, 2020 For Application Serial No. 20180807.8.
(Continued)

*Primary Examiner* — Ajay Arora
(74) *Attorney, Agent, or Firm* — F. CHAU & ASSOCIATES, LLC

(57) ABSTRACT

A method of manufacturing a display panel includes preparing a work substrate that includes a mother substrate that has a plurality of cell areas, a light emitting element layer formed in each of the cell areas, and an encapsulation layer formed on each cell area, disposing a plurality of protective films in the cell areas, respectively, that cover the light emitting element layer and the encapsulation layer, cutting the work substrate along cutting lines at an outer side of the protective films of each cell area to form a preliminary display panel, grinding side surfaces of the preliminary display panel, and removing the protective films from each ground preliminary display panel to form the display panel.

4 Claims, 22 Drawing Sheets

(51) Int. Cl.
*H10K 59/12* (2023.01)
*H10K 71/80* (2023.01)

(58) Field of Classification Search
USPC .......................................................... 257/40
See application file for complete search history.

(56) References Cited

U.S. PATENT DOCUMENTS

| | | | |
|---|---|---|---|
| 8,721,392 | B2 | 5/2014 | Brown et al. |
| 8,854,591 | B2 | 10/2014 | Liu et al. |
| 9,474,125 | B2 | 10/2016 | Kim et al. |
| 9,720,268 | B2 | 8/2017 | Liu et al. |
| 2004/0187669 | A1 | 9/2004 | Nishiyama |
| 2007/0090100 | A1 | 4/2007 | Yonai et al. |
| 2008/0064137 | A1 | 3/2008 | O'Donnell |
| 2014/0097407 | A1* | 4/2014 | Oh ................. H10K 50/805 438/34 |
| 2014/0098055 | A1* | 4/2014 | Choi ................. G06F 3/044 345/173 |
| 2014/0098058 | A1 | 4/2014 | Choi et al. |
| 2014/0360651 | A1 | 12/2014 | Huang et al. |
| 2015/0243700 | A1 | 8/2015 | Morooka |
| 2018/0136509 | A1 | 5/2018 | Shigeta |
| 2019/0165309 | A1 | 5/2019 | Kim et al. |
| 2019/0181387 | A1 | 6/2019 | Go et al. |
| 2020/0403189 | A1 | 12/2020 | Lee et al. |

FOREIGN PATENT DOCUMENTS

| | | |
|---|---|---|
| JP | 3932301 | 3/2007 |
| KR | 10-2005-0013887 | 2/2005 |
| KR | 10-0692056 | 3/2007 |
| KR | 1020070109405 | 11/2007 |
| KR | 10-1032942 | 5/2011 |
| KR | 10-2012-0038947 | 4/2012 |
| KR | 10-2014-0021823 | 2/2014 |
| KR | 10-2016-0128088 | 11/2016 |
| KR | 10-1798447 | 11/2017 |
| KR | 10-2019-0063493 | 6/2019 |

OTHER PUBLICATIONS

Jin-Seong Park, et al., "Thin Film Encapsulation for Flexible AM-OLED: A Review," Semiconductor Science and Technology, 26, (2011) pp. 1-8.

* cited by examiner

DISPLAY PANEL WITH A SUBSTRATE HAVING CURVED SURFACES

CROSS-REFERENCE TO RELATED APPLICATION

This U.S. non-provisional patent application is a divisional of U.S. patent application Ser. No. 16/855,645, filed on Apr. 22, 2020 in the U.S. Patent and Trademark Office, which claims priority under 35 U.S.C. § 119 from, and the benefit of, Korean Patent Application No. 10-2019-0072694, filed on Jun. 19, 2019 in the Korean Intellectual Property Office, the contents of both of which are herein incorporated by reference in their entireties.

BACKGROUND

Technical Field

Embodiments of the present disclosure are directed to a display panel and a method of manufacturing the same. More particularly, the present disclosure is directed to a display panel with enhanced strength and a method of manufacturing the display panel.

Discussion of the Related Art

Electronic devices, such as a smartphone, a tablet computer, a notebook computer, and a smart television, are being developed. These electronic devices typically include a display device to provide information. These electronic devices further include a variety of electronic modules in addition to the display device.

In recent years, display devices have used a display panel that includes an organic electroluminescent element as its display element. A display panel that includes an organic electroluminescent element is thinner than a liquid crystal display panel. Various methods to reinforce the strength of a thinner display panel are being developed.

SUMMARY

Embodiments of the present disclosure can provide a display panel with enhanced strength.

Embodiments of the present disclosure can provide a method of manufacturing a display panel with enhanced strength.

Embodiments of the inventive concept provide a method of manufacturing a display panel that includes preparing a work substrate that includes a mother substrate that has a plurality of cell areas, a light emitting element layer formed in each of the cell areas, and an encapsulation layer formed in each of the cell areas, disposing a plurality of protective films in the cell areas, respectively, that cover the light emitting element layer and the encapsulation layer, cutting the work substrate along cutting lines at an outer side of the protective films of at least one cell area where at least one preliminary display panel is formed, grinding side surfaces of the at least one preliminary display panel, and removing the protective film from at least one ground preliminary display panel where at least one display panel is formed.

Embodiments of the inventive concept provide a display panel that includes a base substrate, a light emitting element layer disposed on one surface of the base substrate, and an encapsulation layer that covers the light emitting element layer. An edge of the base substrate includes a straight-line-shaped portion that has a straight line shape and a shape processing portion that includes at least one curved-surface-shaped portion that has a curved shape.

The at least one curved-surface-shaped portion includes a first curved-line grind surface provided at a front surface edge of the base substrate and a second curved-line grind surface provided at a rear surface edge of the base substrate.

Embodiments of the inventive concept also provide a method of manufacturing a display panel that includes providing a plurality of preliminary display panels, wherein each preliminary display panel comprises a cell area and a protective film that covers the cell area, where the cell area includes side surfaces, grinding a straight-line-shaped portion of the side surfaces where the straight-line-shaped portion has a straight line shape, grinding a curved-surface-shaped portion of the side surfaces where the curved-surface-shaped portion has a curved shape, grinding a pad portion of the side surfaces that is adjacent to a pad area in which a plurality of pads is disposed, and removing the protective films from each ground preliminary display panel where a plurality of display panels are formed.

According to the above, a display panel includes one base substrate, and ground surfaces are provided at edges of the base substrate by a grinding process. Since cracks are removed from the side surfaces of the base substrate by the grinding process, the strength of the display panel may be enhanced.

DETAILED DESCRIPTION

Hereinafter, exemplary embodiments of the present disclosure will be described in detail with reference to the accompanying drawings. However, embodiments of the present disclosure may take many different forms, and should not be construed as being limited to the embodiments set forth herein. Like numbers may refer to like elements throughout.

It will be understood that when an element or layer is referred to as being "on", "connected to" or "coupled to" another element or layer, it can be directly on, connected or coupled to the other element or layer or intervening elements or layers may be present.

Herein, when one value is described as being about equal to another value, e.g. "a width may be from about 0.1 mm to about 1 mm", it is to be understood that the values are equal to each other to within a measurement error, or if measureably unequal, are close enough in value to be functionally equal to each other as would be understood by a person having ordinary skill in the art.

Hereinafter, exemplary embodiments of the present disclosure will be described in detail with reference to the accompanying drawings.

Figure 1:
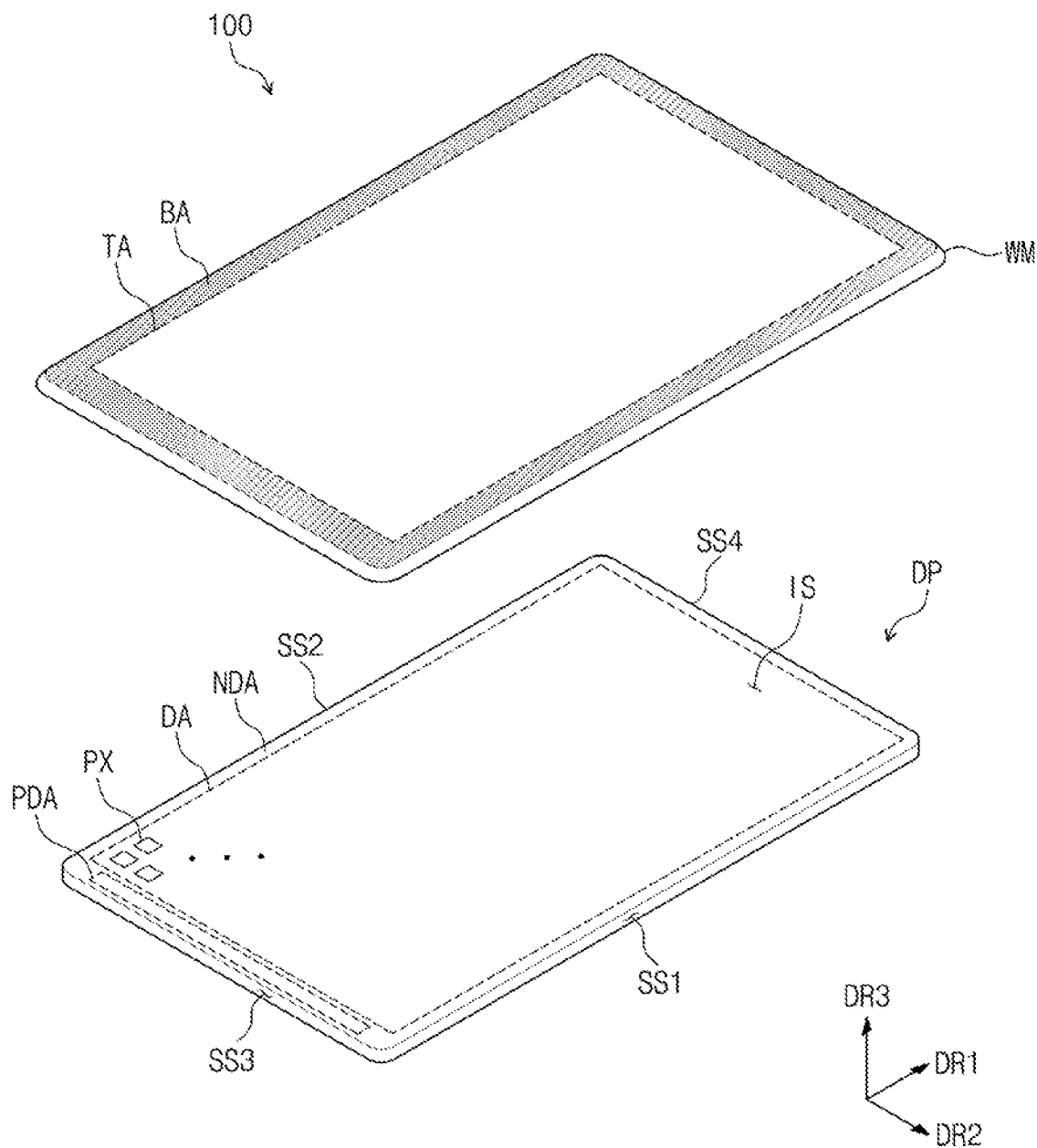
FIG. 1 is an exploded perspective view of a display device according to an exemplary embodiment of the present disclosure.
Figure 2:
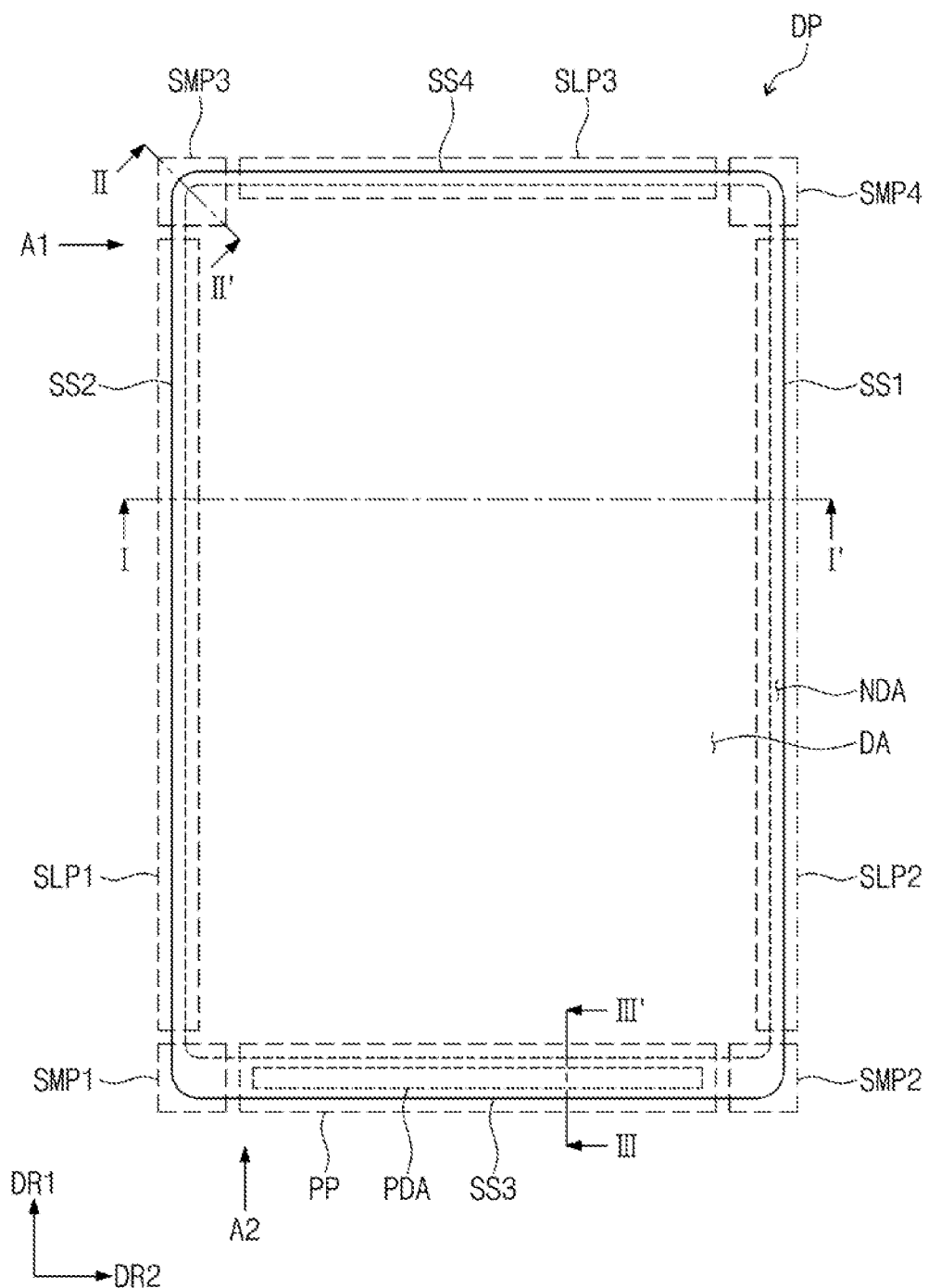
FIG. 2 is a plan view of a display panel shown in FIG. 1.
Figure 3:
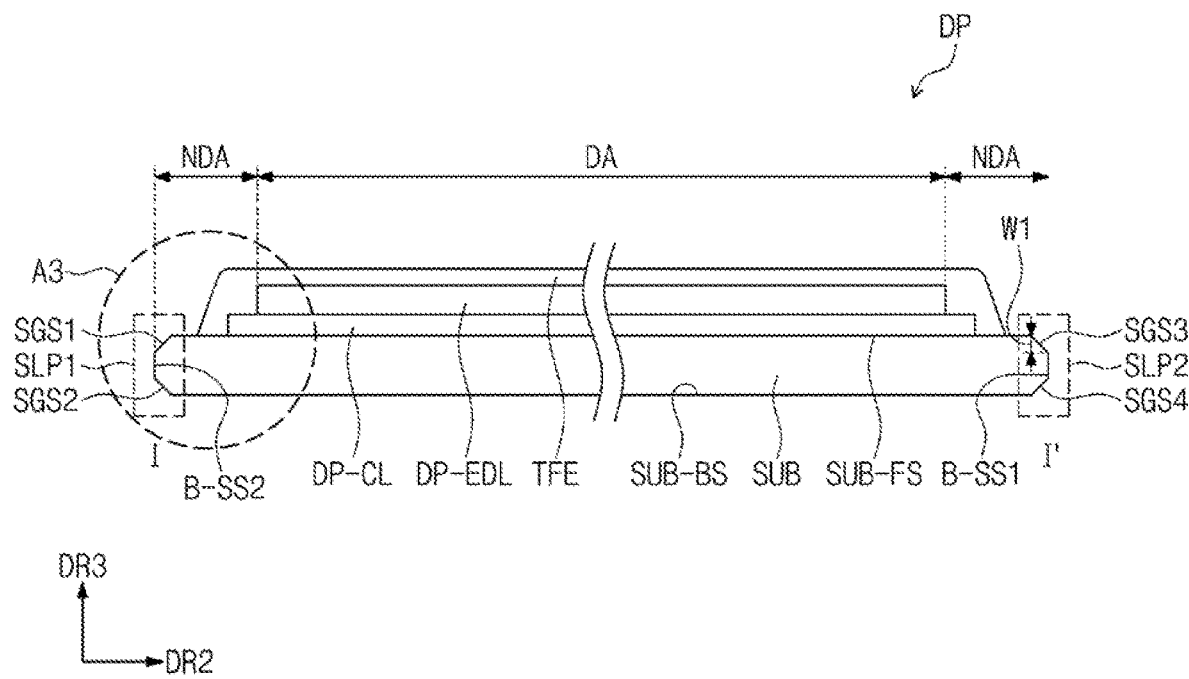
FIG. 3 is a cross-sectional view taken along a line I-I' in FIG. 2.

FIG. 1 is an exploded perspective view of a display device according to an exemplary embodiment of the present disclosure, FIG. 2 is a plan view of a display panel shown in FIG. 1, and FIG. 3 is a cross-sectional view taken along a line I-I' in FIG. 2.

Referring to FIG. 1, the display device 100 includes a display panel DP and a window WM.

According to an embodiment, the display panel DP includes a display area DA that displays an image in response to electrical signals and a non-display area NDA adjacent to the display area DA. The display panel DP includes a plurality of pixels PX. The pixels PX are disposed in the display area DA. The non-display area NDA surrounds the display area DA, and no image is displayed through the non-display area NDA. The non-display area NDA includes a pad area PDA at one side portion of the display panel DP. A plurality of pads are disposed in the pad area PDA of the display panel DP.

According to an embodiment, the display panel DP has a rectangular shape that includes four sides when viewed in a plan view. The display panel DP has a rectangular plate shape. The display panel DP includes a front, display surface IS through which an image is displayed, a rear surface opposite to the front surface IS, and side surfaces SS1 to SS4 that connect the front surface IS and the rear surface. The display surface IS is parallel to a plane defined by a first direction DR1 and a second direction DR2 that crosses the first direction DR1. A normal to the display surface IS, is indicated by a third direction DR3, which is a thickness direction of the display panel DP.

According to an embodiment, the side surfaces SS1 to SS4 include first, second, third, and fourth side surfaces SS1, SS2, SS3, and SS4. The first and second side surfaces SS1 and SS2 are substantially parallel to each other, extend in the first direction DR1, and are parallel to a plane defined by the first and third directions DR1 and DR3. The third and fourth side surfaces SS3 and SS4 are substantially parallel to each other, extend in the second direction DR2, and are parallel to a plane defined by the second and third directions DR2 and DR3. The third side surface SS3 connects the first and second side surfaces SS1 and SS2 along one side portion of the display panel DP, and the fourth side surface SS4 connects the first and second side surfaces SS1 and SS2 along the other side portion of the display panel DP. According to an embodiment of the present disclosure, the third side surface SS3 is disposed adjacent to the pad area PDA.

In FIGS. 1 and 2, according to an embodiment, the display panel DP has a typical shape such as a rectangular shape, however, embodiments of the present disclosure are not limited thereto. That is, the display panel DP can have an atypical shape, such as a shape in which at least one side portion protrudes or is recessed from the rectangular shape. An atypically shaped display panel DP will be described with reference to FIGS. 15 and 16.

According to an embodiment, a window WM is disposed on the display panel DP. The window WM protects the display panel DP. The window WM can be divided into a transmission area TA and a bezel area BA in a plan view. The transmission area TA transmits most light incident thereto. The transmission area TA is optically transparent.

According to an embodiment, the bezel area BA blocks most light incident thereto. The bezel area BA allows components disposed under the window WM to be not recognized from the outside, i.e., hides components disposed under the window WM. In addition, the bezel area BA reduces reflection of external light incident thereto.

According to an embodiment, the bezel area BA is adjacent to the transmission area TA. The transmission area TA has a shape defined by the bezel area BA in a plan view. In a present exemplary embodiment, the transmission area TA covers at least the display area DA of the display panel DP. The bezel area BA covers the non-display area NDA of the display panel DP. However, in other embodiments, the bezel area BA covers a portion of the display area DA.

Referring to FIG. 2, according to an embodiment, an edge of the display panel DP includes straight-line-shaped portions SLP1 to SLP3 and shape processing portions SMP1 to SMP4. The straight-line-shaped portions SLP1 to SLP3 and the shape processing portions SMP1 to SMP4 are located along the edge of the display panel DP. That is, the edge of the display panel DP has a straight line shape in the straight-line-shaped portions SLP1 to SLP3, and the edge of the display panel DP has a curved surface shape or has a shape recessed into or protruding from a side surface of the display panel DP in the shape processing portions SMP1 to SMP4.

According to an embodiment of the present disclosure, the straight-line-shaped portions SLP1 to SLP3 include first, second, and third straight-line-shaped portions SLP1, SLP2, and SLP3. The first, second, and third straight-line-shaped portions SLP1, SLP2, and SLP3 may be respectively provided on second, first, and fourth side surfaces SS2, SS1, and SS4. That is, the first straight-line-shaped portion SLP1 overlaps the second side surface SS2, the second straight-line-shaped portion SLP2 overlaps the first side surface SS1, and the third straight-line-shaped portion SLP3 overlaps the fourth side surface SS4.

According to an embodiment of the present disclosure, the shape processing portions SMP1 to SMP4 include first, second, third, and fourth curved-surface-shaped portions SMP1, SMP2, SMP3, and SMP4. The first curved-surface-shaped portion SMP1 is provided where the second and third side surfaces SS2 and SS3 are connected to each other. The second curved-surface-shaped portion SMP2 is provided where the first and third side surfaces SS2 and SS3 are connected to each other. The third curved-surface-shaped portion SMP3 is provided where the second and fourth side surfaces SS2 and SS4 are connected to each other. The fourth curved-surface-shaped portion SMP4 is provided where the first and fourth side surfaces SS1 and SS4 are connected to each other. Each of the first to fourth curved-surface-shaped portions SMP1 to SMP4 is curved to have a rounded shape.

According to an embodiment, the edges of the display panel DP further include a pad portion PP adjacent to the pad area PDA. The pad portion PP overlaps the third side surface SS3 and is disposed between the first and second curved-surface-shaped portions SMP1 and SMP2.

Referring to FIG. 3, according to an embodiment, the display panel DP includes a base substrate SUB, a display circuit layer DP-CL, a light emitting element layer DP-EDL, and an encapsulation layer TFE. The base substrate SUB, the display circuit layer DP-CL, and the light emitting element layer DP-EDL are sequentially stacked one on another in the third direction DR3.

According to an embodiment, the base substrate SUB includes a front surface SUB-FS, a rear surface SUB-BS opposite to the front surface SUB-FS, and a side surface that connects the front surface SUB-FS and the rear surface SUB-BS. The display circuit layer DP-CL is disposed on the front surface SUB-FS of the base substrate SUB. The base substrate SUB can be, but is not limited to, a glass substrate. The base substrate SUB has a thickness of from about 100 micrometers to about 400 micrometers.

According to an embodiment, the display circuit layer DP-CL includes a plurality of transistors. Each of the transistors includes a control electrode, an input electrode, and an output electrode. For example, the display circuit layer DP-CL includes a switching transistor and a driving transistor, which are used to drive the organic electroluminescent light emitting element.

According to an embodiment, the light emitting element layer DP-EDL is disposed on the display circuit layer DP-CL. The light emitting element layer DP-EDL includes a plurality of organic electroluminescent light emitting elements.

The light emitting element layer DP-EDL and the display circuit layer DP-CL will be described in detail with reference to FIG. 14.

According to an embodiment, the encapsulation n layer TFE is disposed on the light emitting element layer DP-EDL. The light emitting element layer DP-EDL is encapsulated by the encapsulation layer TFE. According to an embodiment of the present disclosure, the encapsulation layer TFE has a structure in which at least one inorganic layer and at least one organic layer are alternately stacked one on another in the third direction DR3.

According to an embodiment, the encapsulation layer TFE protects the light emitting element layer DP-EDL from moisture, oxygen and from foreign substances, such as dust particles.

As shown in FIGS. 2 and 3, according to an embodiment, the first straight-line-shaped portion SLP1 of the display panel DP includes first and second straight-line grind surfaces SGS1 and SGS2, and the second straight-line-shaped portion SLP2 of the display panel DP includes third and fourth straight-line grind surfaces SGS3 and SGS4. In a present exemplary embodiment, the first side surface SS1 of the display panel DP corresponds to a first side surface B-SS1 of the base substrate SUB, and the second side surface SS2 of the display panel DP corresponds to a second side surface B-SS2 of the base substrate SUB.

According to an embodiment, the first straight-line grind surface SGS1 is disposed between a second side surface B-SS2 of the base substrate SUB and the front surface SUB-FS of the base substrate SUB, and the second straight-line grind surface SGS2 is disposed between the second side surface B-SS2 of the base substrate SUB and the rear surface SUB-BS of the base substrate SUB. The third straight-line grind surface SGS3 is disposed between the first side surface B-SS1 of the base substrate SUB and the front surface SUB-FS of the base substrate SUB, and the fourth straight-line grind surface SGS4 is disposed between the first side surface B-SS1 of the base substrate SUB and the rear surface SUB-BS of the base substrate SUB.

According to an embodiment, each of the first to fourth straight-line grind surfaces SGS1 to SGS4 has an inclined surface. Each of the first to fourth straight-line grind surfaces SGS1 to SGS4 has a first width W1 in a thickness direction, i.e., the third direction DR3, of the display panel DP.

In addition, according to an embodiment, the third straight-line-shaped portion SLP3 includes fifth and sixth straight-line grind surfaces connected to a fourth side surface of the base substrate SUB. The fourth side surface of the base substrate SUB corresponds to the fourth side surface SS4 of the display panel DP. The fifth and sixth straight-line grind surfaces have the first width W1 in the third direction DR3. According to an embodiment of the present disclosure, the first width W1 has a value within a range of from about 20 micrometers to about 100 micrometers.

As described above, according to an embodiment, when the straight-line grind surfaces are formed in the first to third straight-line-shaped portions SLP1 to SLP3, the strength of the edge portion of the base substrate SUB is reinforced. The straight-line grind surfaces of the first to third straight-line-shaped portions SLP1 to SLP3 can be formed through a grinding process. The straight-line grind surfaces have a width that varies depending on how the grinding process is carried out or the device that performs the grinding process. According to an embodiment of the present disclosure, the straight-line grind surfaces shown in FIG. 3 are formed through a computer numerical control (CNC) grinding process. When the CNC grinding process is performed, each of the straight-line-shaped portions SLP1 to SLP3 is provided with a pair of straight-line grind surfaces that respectively connect the front surface SUB-FS and the rear surface SUB-BS of the base substrate SUB. That is, the pair of straight-line grind surfaces are substantially simultaneously formed through the CNC grinding process. The CNC grinding process will be described in detail below with reference to accompanying drawings.

When two surfaces, such as the first side surface B-SS1 and the front surface SUB-FS of the base substrate SUB, meet at a right angle in an edge portion of the base substrate SUB, a sharp edge is formed, and the base substrate SUB may be vulnerable to external impacts. However, when the inclined straight-line grind surfaces are provided in the first to third straight-line-shaped portions SLP1 to SLP3, defects due to the external impacts, such as cracks, can be prevented from occurring in the base substrate SUB, and as a result, the strength of the display panel DP is reinforced.

Figure 4A:
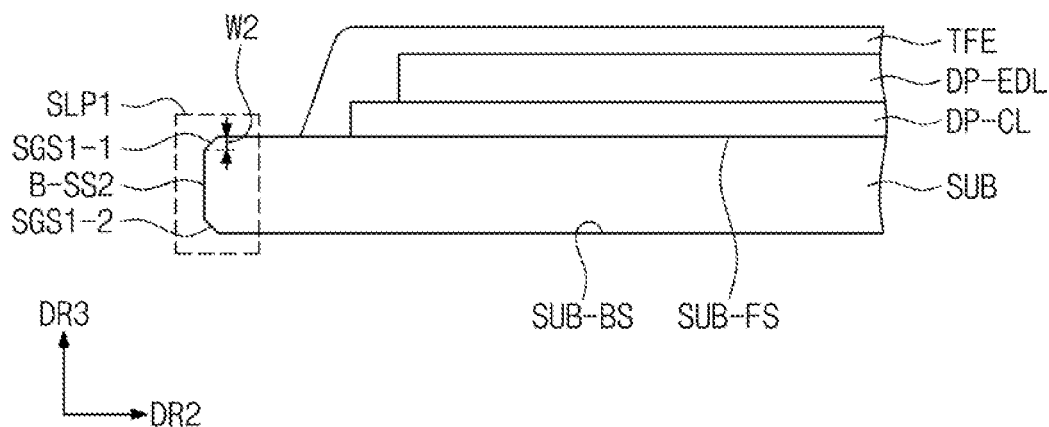
FIGS. 4A to 4C are cross-sectional views of a straight-line-shaped portion according to an exemplary embodiment of the present disclosure.
Figure 4B:
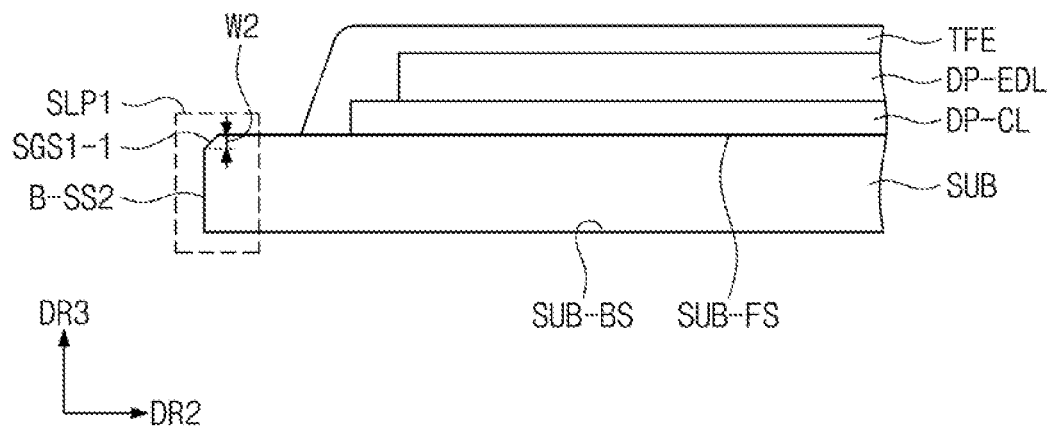
Figure 4C:
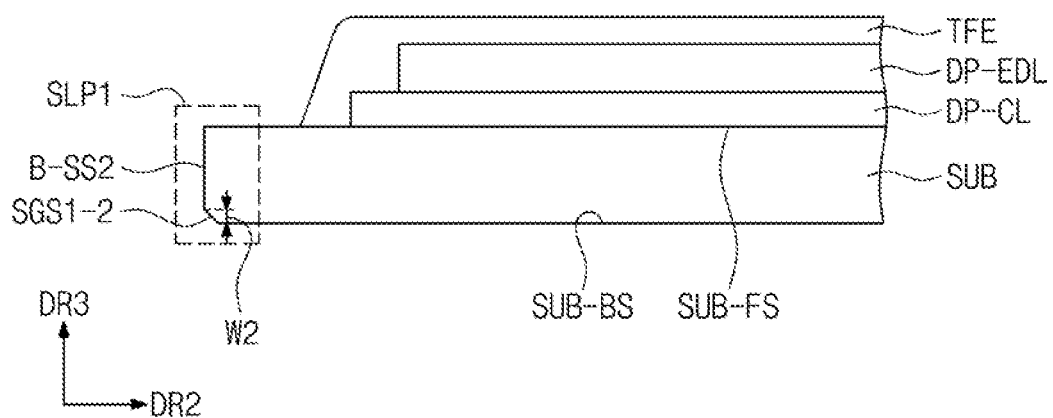

FIGS. 4A to 4C are cross-sectional views of a straight-line-shaped portion according to an exemplary embodiment of the present disclosure. FIGS. 4A to 4C show a cross-sectional structure of the first straight-line-shaped portion SLP1 of the first to third straight-line-shaped portions SLP1 to SLP3.

According to embodiments, the first to third straight-line-shaped portions SLP1 to SLP3 may have substantially the same shape as each other or may have different shapes from each other. Each of the first to third straight-line-shaped portions SLP1 to SLP3 can have one of the shapes shown in FIGS. 3 to 4C. Accordingly, the shape of the first straight-line-shaped portion SLP1 will be described with reference to FIGS. 4A to 4C as a representative example, however, the structure should not be limited to the first straight-line-shaped portion SLP1, and may be incorporated into the second and third straight-line-shaped portions SLP2 and SLP3.

Referring to FIGS. 2 and 4A, according to an embodiment, the first straight-line-shaped portion SLP1 of the display panel DP overlaps the second side surface SS2, and the first straight-line-shaped portion SLP1 includes first and second straight-line grind surfaces SGS1-1 and SGS1-2. In this case, the second side surface SS2 of the display panel DP corresponds to the second side surface B-SS2 of the base substrate SUB.

According to an embodiment, the first straight-line grind surface SGS1-1 is disposed between the second side surface B-SS2 of the base substrate SUB and the front surface SUB-FS of the base substrate SUB, and the second straight-line grind surface SGS1-2 is disposed between the second side surface B-SS2 of the base substrate SUB and the rear surface SUB-BS of the base substrate SUB.

According to an embodiment, each of the first and second straight-line grind surfaces SGS1-1 and SGS1-2 has an inclined surface. Each of the first and second straight-line grind surfaces SGS1-1 and SGS1-2 has a second width W2 in the thickness direction, which is the third direction DR3, of the display panel DP. According to an embodiment of the present disclosure, the second width W2 is less than the first width W1, and the second width W2 has a value within a range of from about 5 micrometers to about 60 micrometers.

According to an embodiment, FIG. 4A shows that the first straight-line-shaped portion SLP1 includes the pair of straight-line grind surfaces SGS1-1 and SGS1-2 respectively connected to the front surface SUB-FS and the rear surface SUB-BS of the base substrate BS, however, embodiments of the present disclosure should not be limited thereto. That is, as shown in FIGS. 4B and 4C, the first straight-line-shaped portion SLP1 may include only one straight-line grind surface. According to FIG. 4B, the first straight-line-shaped portion SLP1 includes one first straight-line grind surface SGS1-1 disposed between the front surface SUB-FS and the second side surface B-SS2 of the base substrate SUB, and according to FIG. 4C, the first straight-line-shaped portion SLP1 includes one second straight-line grind surface SGS1-2 disposed between the rear surface SUB-BS and the second side surface B-SS2 of the base substrate SUB.

As described above, according to an embodiment, as the straight-line grind surfaces are formed in the first straight-line-shaped portion SLP1, the strength of the edge portion of the base substrate SUB is reinforced. According to an embodiment of the present disclosure, the straight-line grind surfaces SGS1-1 and SGS1-2 shown in FIGS. 4A to 4C can be formed through an edge grinding process. After the edge grinding process is performed, the first straight-line-shaped portion SLP1 includes at least one straight-line grind surface. The straight-line grind surface formed through the edge grinding process is less wide than the straight-line grind surfaces SGS1 to SGS4 shown in FIG. 3 that are formed through the CNC grinding process.

When two surfaces, such as the second side surface B-SS2 and the front surface SUB-FS of the base substrate SUB, meet at a right angle in an edge portion of the base substrate SUB, a sharp edge is formed, and the base substrate SUB may be vulnerable to external impacts. However, when one or more inclined straight-line grind surfaces are provided in the first straight-line-shaped portion SLP1, defects due to the external impacts, such as cracks, can be prevented from occurring in the base substrate SUB, and as a result, the strength of the display panel DP is reinforced.

Figure 5:
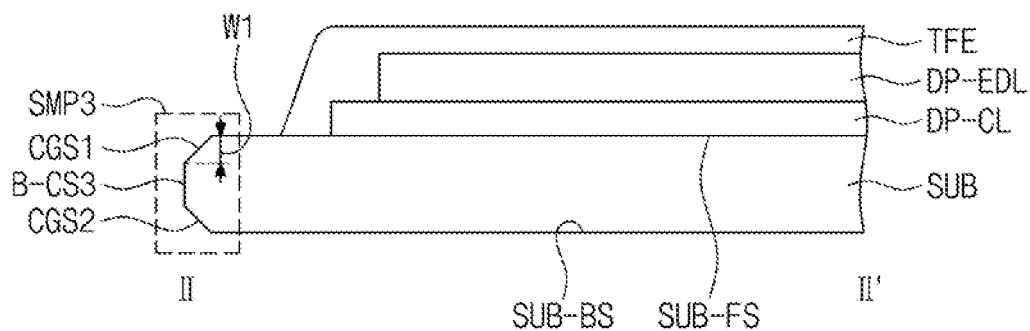
FIG. 5 is a cross-sectional view taken along a line II-II' in FIG. 2.
Figure 6:
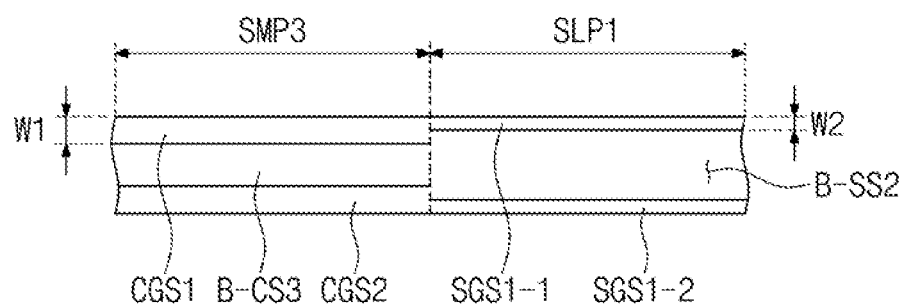
FIG. 6 is a side view of a first straight-line-shaped portion and a third curved-surface-shaped portion when viewed in a direction A1 in FIG. 2.

FIG. 5 is a cross-sectional view of a shape processing portion taken along a line II-II' shown in FIG. 2, and FIG. 6 is a side view showing a first straight-line-shaped portion and a third shape processing portion when viewed in a direction A1 in FIG. 2. FIG. 5 shows a cross-sectional structure of the third curved-surface-shaped portion SMP3 of the first to fourth curved-surface-shaped portions SMP1 to SMP4.

According to an embodiment, the first to fourth curved-surface-shaped portions SMP1 to SMP4 have substantially the same shape as each other. Accordingly, the shape of the third curved-surface-shaped portion SMP3 will be described as a representative example, and detailed descriptions of the first, second, and fourth curved-surface-shaped portions SMP1, SMP2, and SMP4 will be omitted.

Referring to FIGS. 2 and 5, according to an embodiment, the third curved-surface-shaped portion SMP3 includes a first curved-line grind surface CGS1 provided at a front surface edge of the base substrate SUB and a second curved-line grind surface CGS2 provided at a rear surface edge of the base substrate SUB. Four corners where two side surfaces of the first to fourth side surfaces of the base substrate SUB are connected to each other are processed to be curved. Therefore, the base substrate SUB includes first, second, third, and fourth curved surfaces respectively provided at four corners. Of the four curved surfaces, the third curved surface B-CS3 is disposed between the second side surface SS2 and the fourth side surface SS4 of the display panel DP.

According to an embodiment, the first curved-line grind surface CGS1 is disposed between the third curved surface B-CS3 of the base substrate SUB and the front surface SUB-FS of the base substrate SUB, and the second curved-line grind surface CGS2 is disposed between the third curved surface B-CS3 of the base substrate SUB and the rear surface SUB-BS of the base substrate SUB.

According to an embodiment, each of the first and second curved-line grind surfaces CGS1 and CGS2 has an inclined curved-line grind surface. Each of the first and second curved-line grind surfaces CGS1 and CGS2 has a first width W1 in the third, thickness direction DR3 of the display panel DP. According to an embodiment of the present disclosure, the first width W1 has a value within a range of from about 20 micrometers to about 100 micrometers.

As described above, according to an embodiment, as the curved-line grind surfaces are formed at the four corners of the base substrate SUB, the strength of the edge portion of the base substrate SUB is reinforced. In particular, the first and second curved-line grind surfaces CGS1 and CSG2 are formed through a grinding process. According to an embodiment of the present disclosure, the first to fourth curved-surface-shaped portions SMP1 to SMP4, which are processed to have curved surfaces, are ground using a CNC grinding process.

When two surfaces, such as the third curved surface B-CS3 and the front surface SUB-FS of the base substrate SUB, meet at a right angle in a corner of the base substrate SUB, a sharp edge is formed, and the base substrate SUB is vulnerable to external impacts. However, when inclined curved-line grind surface are provided in the first to fourth curved-surface-shaped portions SMP1 to SMP4, defects due to external impacts, such as cracks, can be prevented from occurring in the base substrate SUB, and as a result, the strength of the display panel DP is reinforced.

Referring to FIGS. 2 to 6, according to an embodiment, the third curved-surface-shaped portion SMP3 includes first and second curved-line grind surfaces CGS1 and CGS2 processed through a CNC grinding process, and the first straight-line-shaped portion SLP1 includes the first and second straight-line grind surfaces SGS1-1 and SGS1-2 processed through an edge grinding process. That is, the first straight-line-shaped portion SLP1 and the third curved-surface-shaped portion SMP3 are ground by different methods. In this case, the first and second curved-line grind surfaces CGS1 and CGS2 have the first width W1, and the first and second straight-line grind surfaces SGS1-1 and SGS1-2 have the second width W2. As described above, since the first and second curved-line grind surfaces CGS1 and CGS2 have a different width from the first and second straight-line grind surfaces SGS1-1 and SGS1-2, a discontinuous interface exists between the first straight-line-shaped portion SLP1 and the third curved-surface-shaped portion SMP3.

In addition, according to an embodiment, a discontinuous interface exists between the first straight-line-shaped portion SLP1 and the first curved-surface-shaped portion SMP1, between the third curved-surface-shaped portion SMP3 and the third straight-line-shaped portion SLP3, between the fourth curved-surface-shaped portion SMP4 and the third straight-line-shaped portion SLP3, between the second straight-line-shaped portion SLP2 and the second curved-surface-shaped portion SMP2, and between the second straight-line-shaped portion SLP2 and the fourth curved-surface-shaped portion SMP4.

Figure 7:
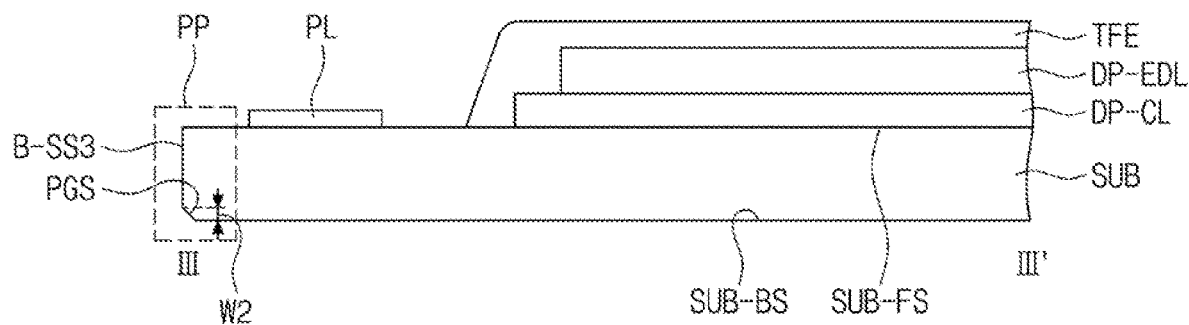
FIG. 7 is a cross-sectional view taken along a line III-III' in FIG. 2.
Figure 8:
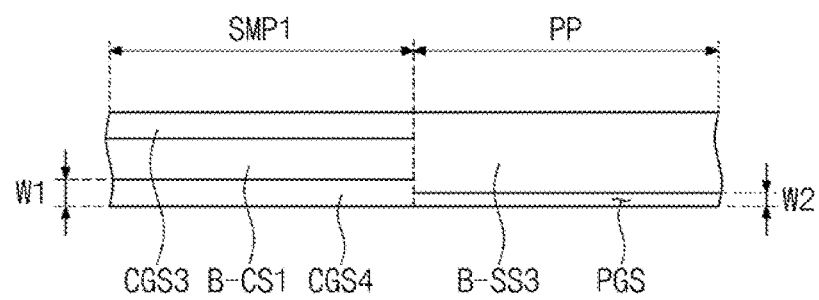
FIG. 8 is a side view of a first curved-surface-shaped portion and a pad portion when viewed in a direction A2 in FIG. 2.

FIG. 7 is a cross-sectional view taken along a line III-III' in FIG. 2, and FIG. 8 is a side view of the first curved-surface-shaped portion and the pad portion when viewed in a direction A2 in FIG. 2.

Referring to FIGS. 2 and 7, according to an embodiment, the pad portion PP includes a pad grinding surface PGS formed at the rear surface edge of the base substrate SUB. The pad grinding surface PGS is formed between a third side surface B-SS3 of the base substrate SUB and the rear surface SUB-BS of the base substrate SUB. Here, the third side surface B-SS3 of the base substrate SUB corresponds to the third side surface SS3 of the display panel DP.

According to an embodiment, the pad grinding surface PGS has an inclined surface. The pad grinding surface PGS has the second width W2 in the third, thickness direction DR3 of the display panel DP. According to an embodiment of the present disclosure, the second width W2 has a value within a range of from about 5 micrometers to about 60 micrometers.

According to an embodiment, no grinding surface is formed at the front surface edge of the base substrate SUB in the pad portion PP. A pad layer PL is formed in the pad area PDA of the base substrate SUB. A flexible circuit film is attached to the pad area PDA of the base substrate SUB. The flexible circuit film is electrically connected to the pad layer PL. In this case, the front surface edge of the base substrate SUB is covered by the flexible circuit film.

According to an embodiment, when the grinding surface is formed at one of the front surface edge and the rear surface edge in the pad portion PP, a CNC grinding process is not performed. That is, the pad grinding surface PGS is formed at the rear surface edge through an edge grinding process. Accordingly, the pad grinding surface PGS prevents the defects due to the external impacts, such as cracks, from occurring in the base substrate SUB, and as a result, the strength of the display panel DP is reinforced in the pad area PDA.

Referring to FIGS. 2 and 8, according to an embodiment, the first curved-surface-shaped portion SMP1 includes the third and fourth curved-line grind surfaces CGS3 and CGS4 processed through a CNC grinding process, and the pad portion PP includes the pad grinding surface PGS processed through an edge grinding process. That is, the pad portion PP and the first curved-surface-shaped portion SMP1 are ground by different processes. In this case, the third and fourth curved-line grind surfaces CGS3 and CGS4 have the first width W1, and the pad grinding surface PGS has the second width W2. As described above, since the pad grinding surface has a different width from the third and fourth curved-line grind surfaces CGS3 and CGS4, a discontinuous interface exists between the pad portion PP and the first curved-surface-shaped portion SMP1.

In addition, according to an embodiment, a discontinuous interface exists between the pad portion PP and the second curved-surface-shaped portion SMP2.

FIGS. 9A to 9D are plan views that illustrate a method of manufacturing a display panel according to an exemplary embodiment of the present disclosure, and FIGS. 10A to 10E are cross-sectional views that illustrate a method of manufacturing a display panel according to an exemplary embodiment of the present disclosure.

Figure 9A:
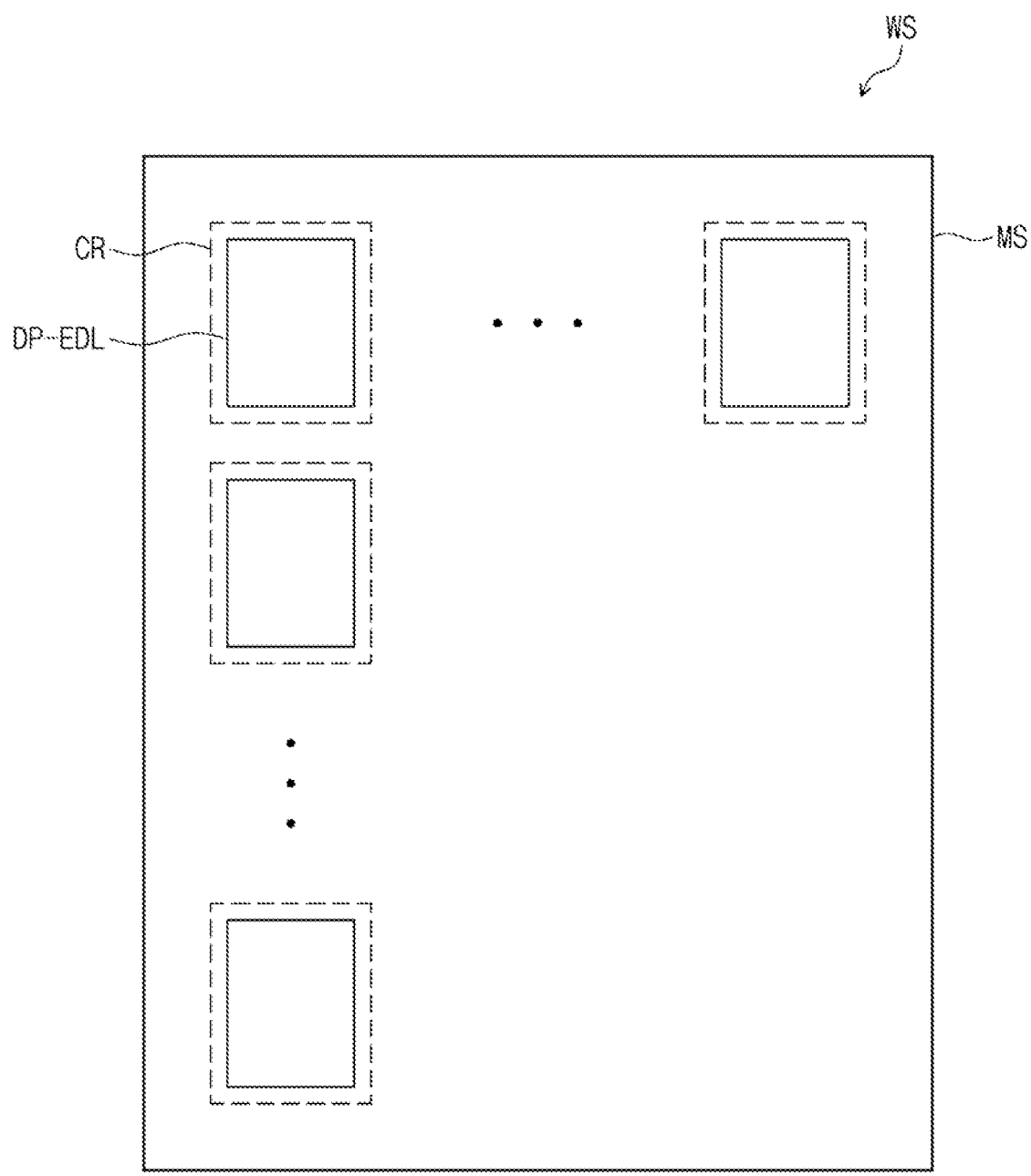
FIGS. 9A to 9D are plan views that illustrate a method of manufacturing a display panel according to an exemplary embodiment of the present disclosure.
Figure 10A:
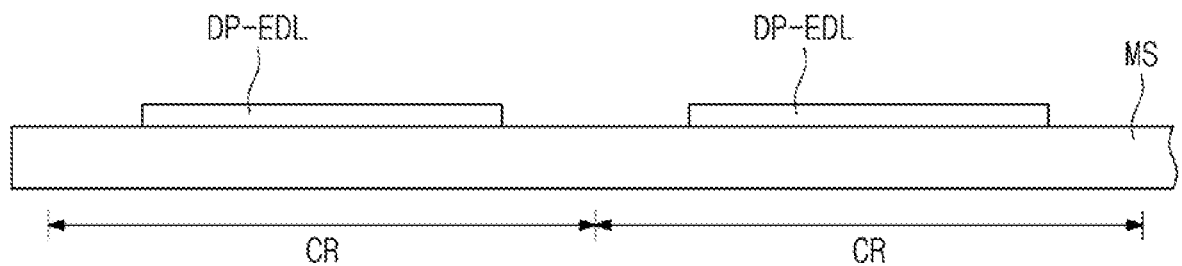
FIGS. 10A to 10E are cross-sectional views that illustrate a method of manufacturing a display panel according to an exemplary embodiment of the present disclosure.

Referring to FIGS. 9A and 10A, according to an embodiment, a plurality of cell areas CR are formed in a mother substrate MS. The mother substrate MS may be, but is not limited to, a glass substrate. The mother substrate MS has a thickness of from about 100 micrometers to about 400 micrometers.

According to an embodiment, each of the cell areas CR corresponds to a display panel DP such as that shown in FIG. 2. A work substrate WS shown in FIG. 9A includes the light emitting element layer DP-EDL formed in each cell area CR of the mother substrate MS. In addition, the work substrate WS further includes the circuit element layer DP-CL shown in FIG. 3 and disposed between the light emitting element layer DP-EDL and the mother substrate MS in each cell area CR. For the convenience of illustration, FIGS. 9A to 10E do not show the circuit element layer DP-CL in the work substrate WS.

According to an embodiment, the light emitting element layer DP-EDL includes the organic electroluminescent light emitting elements. Elements included in the light emitting element layer DP-EDL may be formed through a deposition process, a photolithography process, or a patterning process.

Figure 9B:
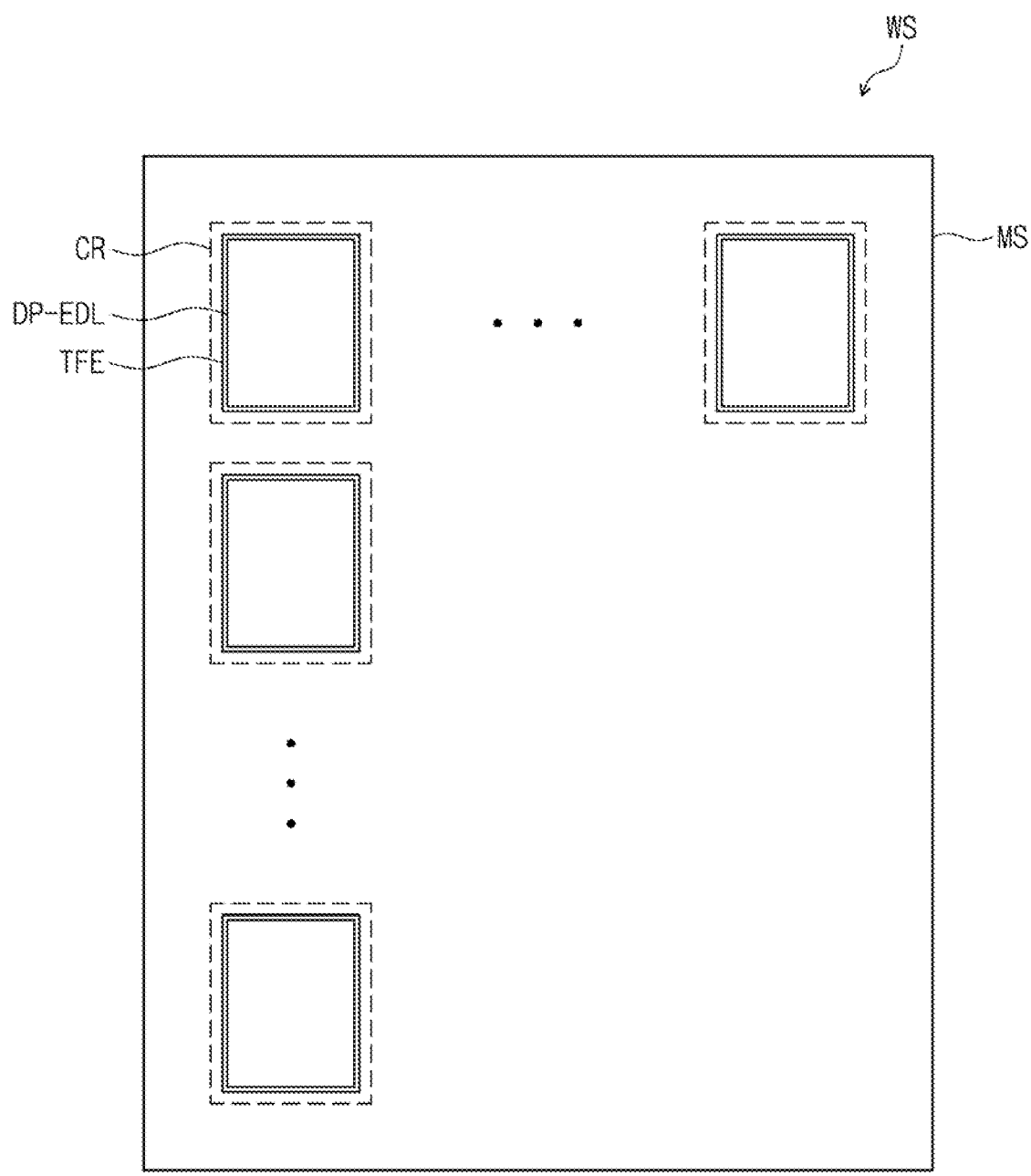
Figure 10B:
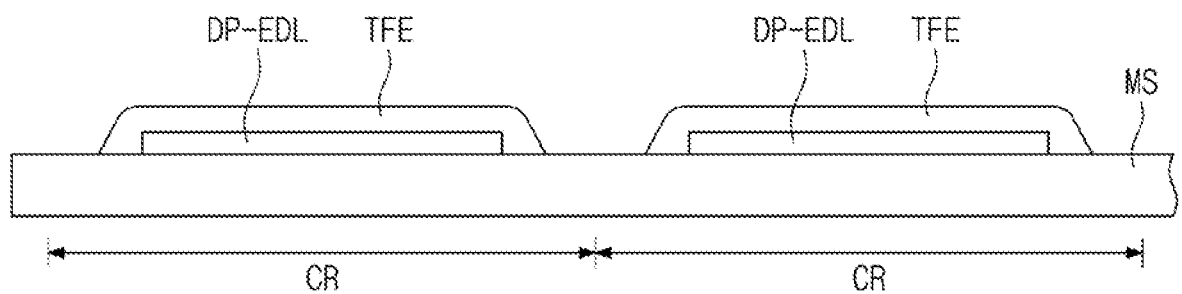

Referring to FIGS. 9B and 10B, according to an embodiment, the work substrate WS further includes the encapsulation layer TFE formed to cover the light emitting element layer DP-EDL. An encapsulation layer TFE is formed for each cell area CR. Accordingly, the light emitting element layer DP-EDL is encapsulated by the encapsulation layer TFE.

Figure 9C:
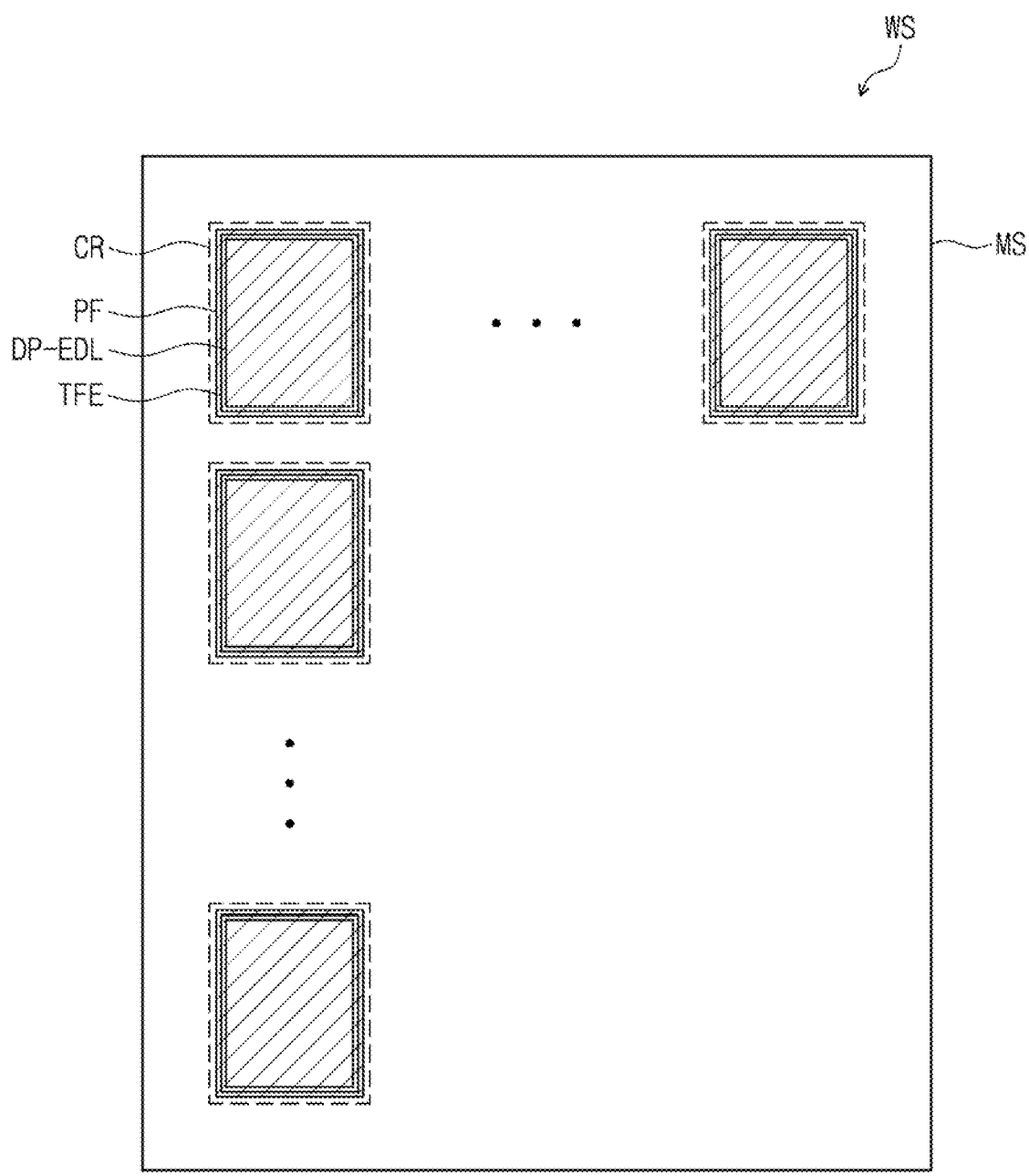
Figure 10C:
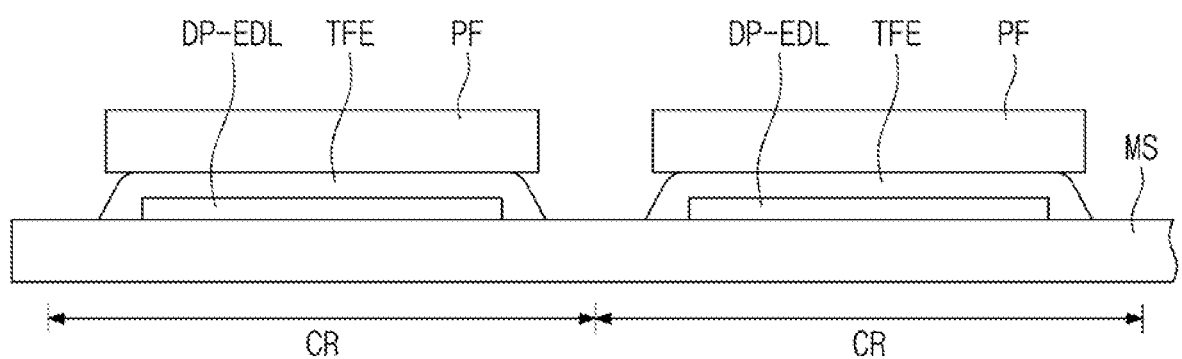

Referring to FIGS. 9C and 10C, according to an embodiment, a protective film PF is disposed on the encapsulation layer TFE. The protective film PF is disposed in each cell area CR. The protective film PF includes a polymer material. For example, the protective film PF includes a polyester material. An adhesive layer is coated on one surface of the protective film PF. The adhesive layer is a pressure sensitive adhesive film. The protective film PF is disposed on the work substrate WS such that the one surface on which the adhesive layer is coated is attached to the encapsulation layer TFE.

Figure 9D:
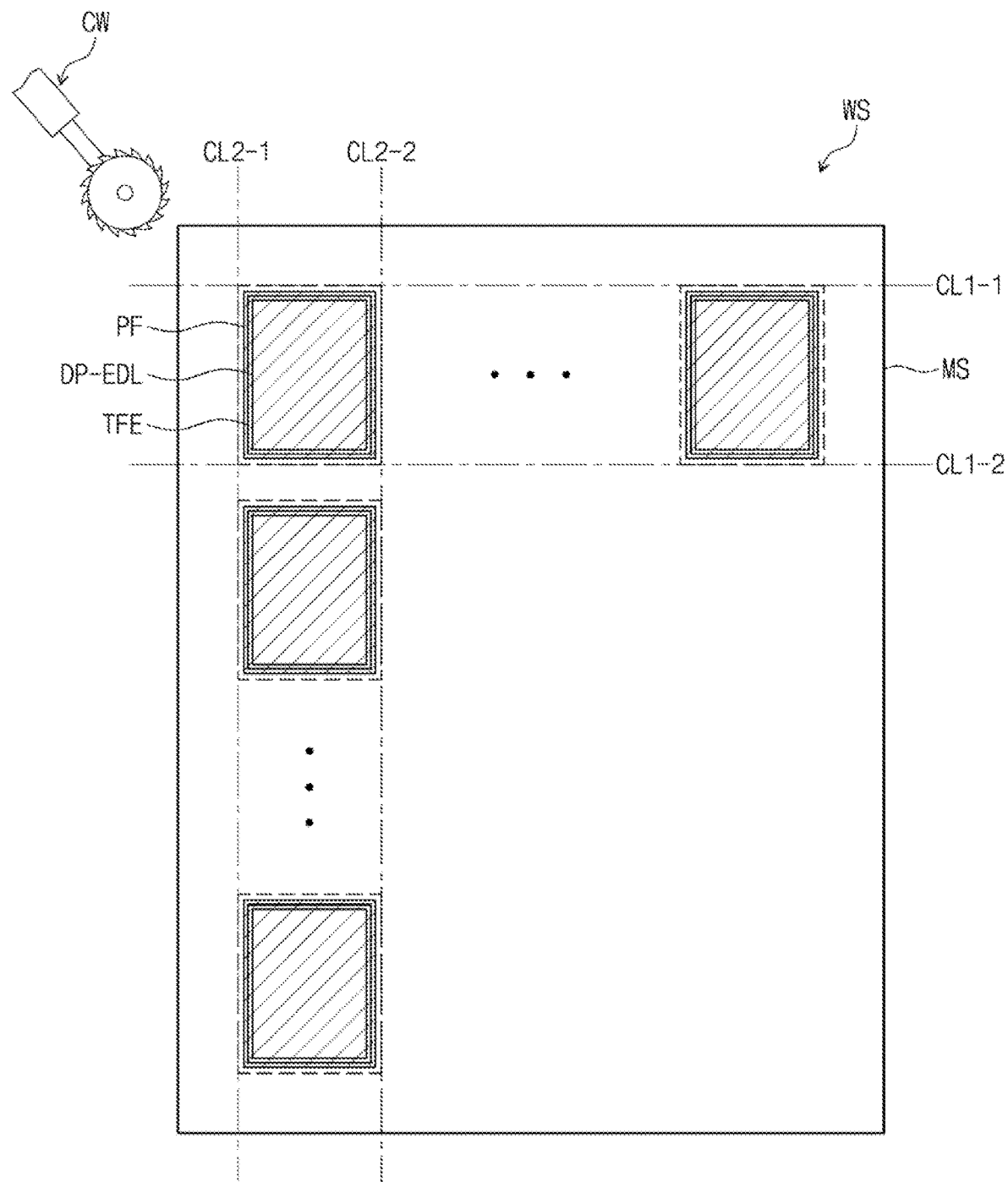
Figure 10D:
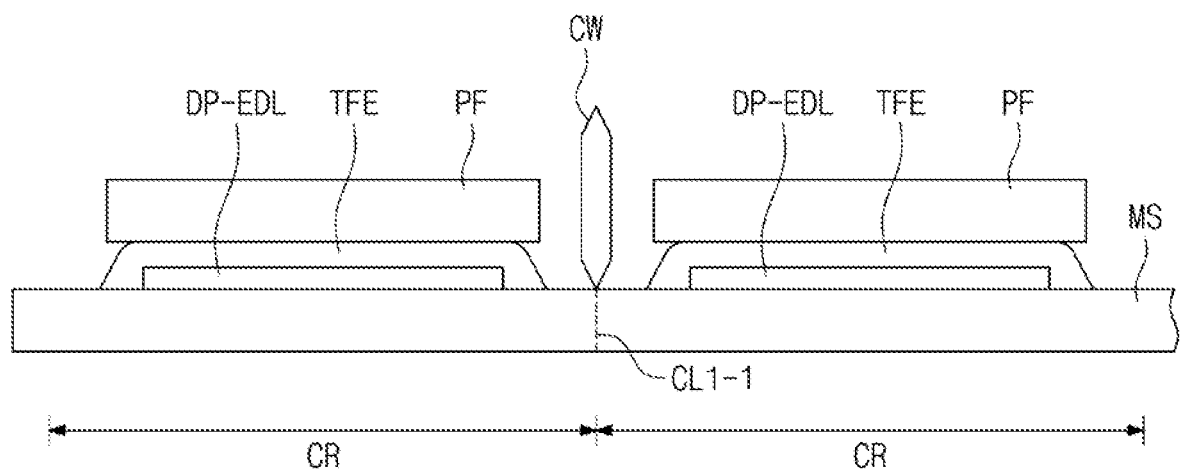

Referring to FIGS. 9D and 10D, according to an embodiment, the work substrate WS is separated into portions that respectively correspond to the cell areas CR. The work substrate WS is cut along a first cutting line CL1-1 and a second cutting line CL1-2 using a cutting device CW. A cut cell portion is cut along a third cutting line CL2-1 and a fourth cutting line CL2-2. The cutting device CW includes a cutting wheel that rotates while moving along the cutting lines.

According to another embodiment of the present disclosure, the cutting device CW includes a laser scanner that irradiates a laser beam onto the cutting lines.

According to an embodiment of the present disclosure, the protective film PF is disposed inside a corresponding cell area CR. That is, the protective film PF does not overlap the cutting lines CL1-1, CL1-2, CL2-1, and CL2-2. Accordingly, when a cutting process is performed, the adjacent protective films are spaced apart from each other to allow the cutting device CW to move without being disturbed by the protective film PF.

Figure 10E:
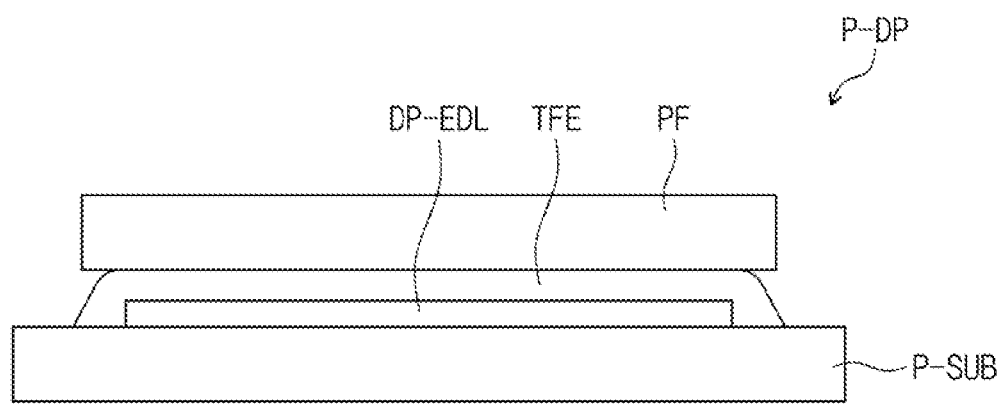

Thus, according to an embodiment, the work substrate WS can be separated into several pieces, hereinafter, referred to as "a plurality of preliminary display panels". In FIG. 10E, a preliminary display panel P-DP of the plurality of preliminary display panels is shown. The preliminary display panel P-DP includes a preliminary base substrate P-SUB that is not ground. Hereinafter, a grinding process of the preliminary base substrate P-SUB will be described with reference to FIGS. 11A to 13C.

Figure 11A:
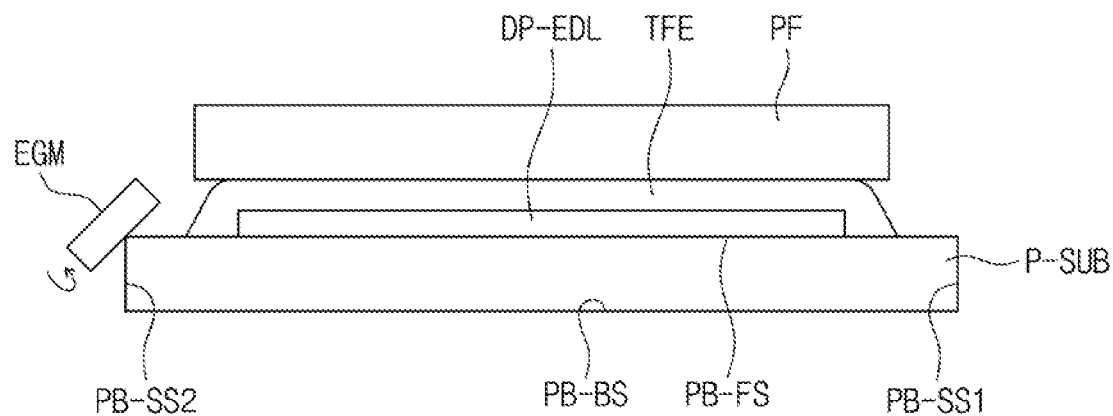
FIGS. 11A to 11C illustrate a grinding process for a straight-line-shaped portion according to an exemplary embodiment of the present disclosure.
Figure 11B:
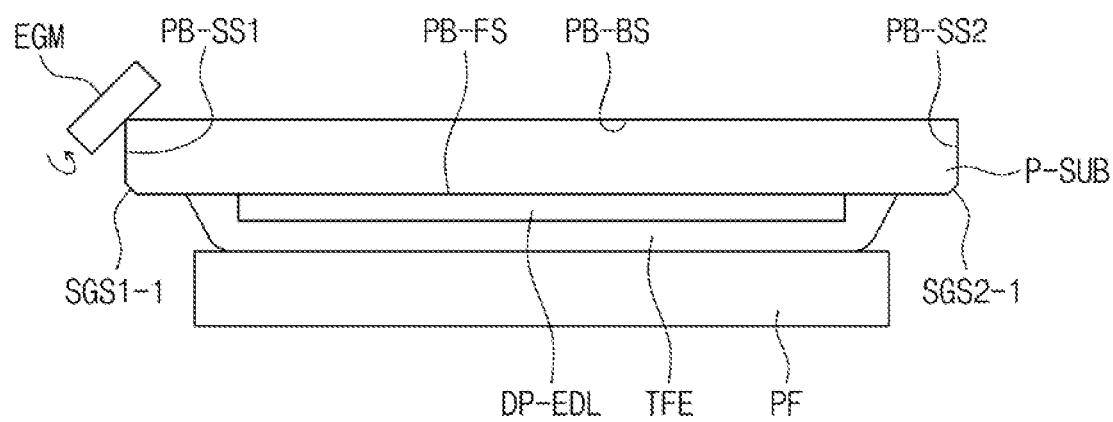
Figure 11C:
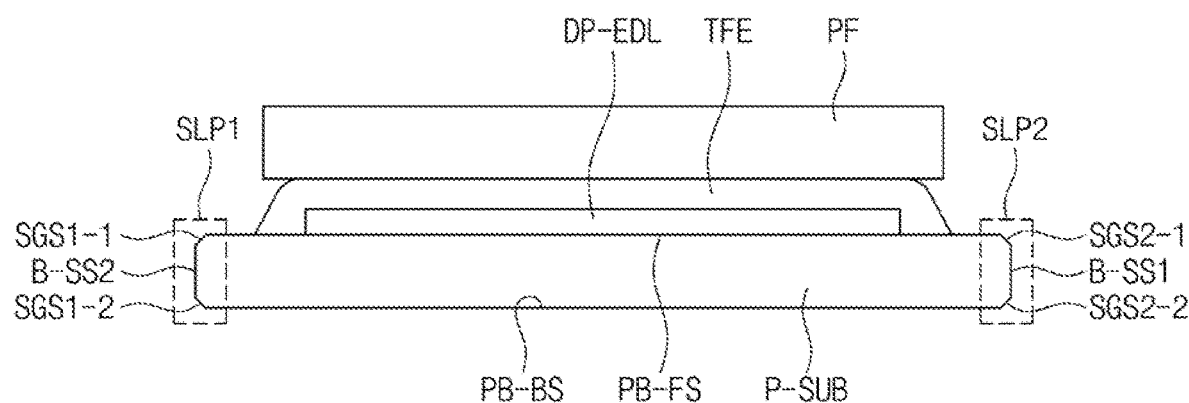
Figure 12A:
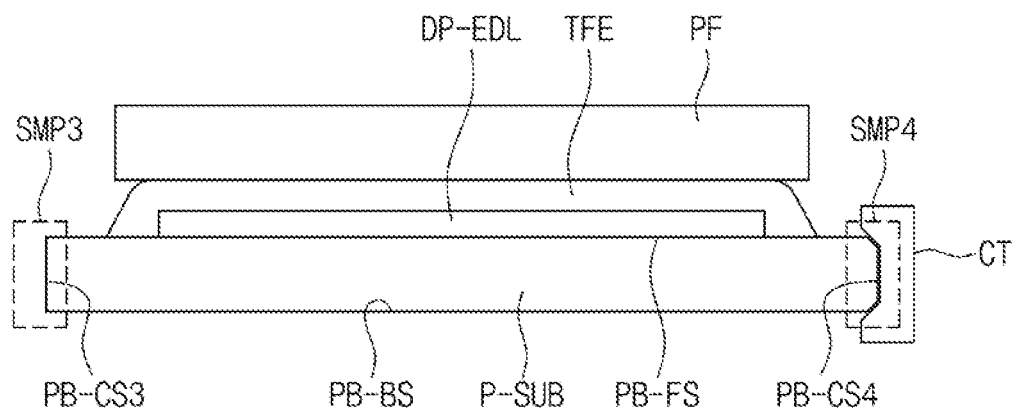
FIGS. 12A and 12B illustrate a grinding process for a shape processing portion according to an exemplary embodiment of the present disclosure.
Figure 12B:
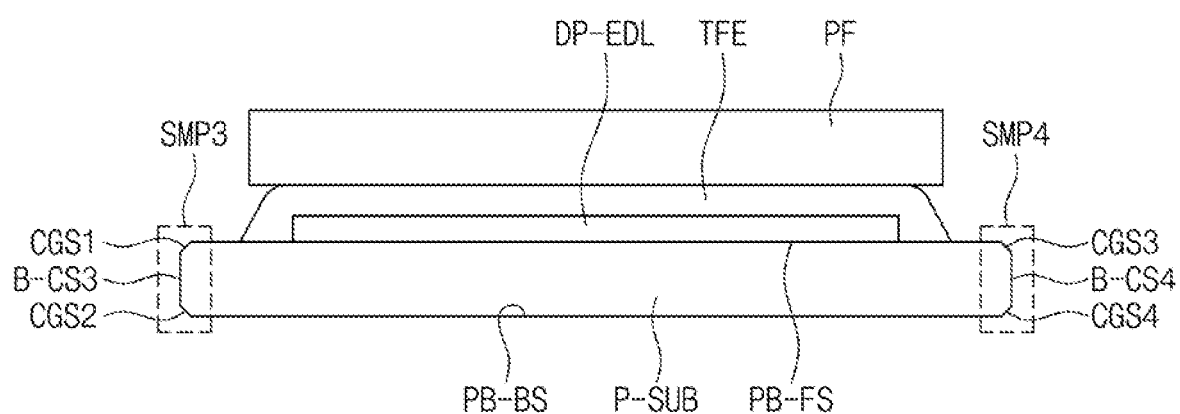
Figure 13A:
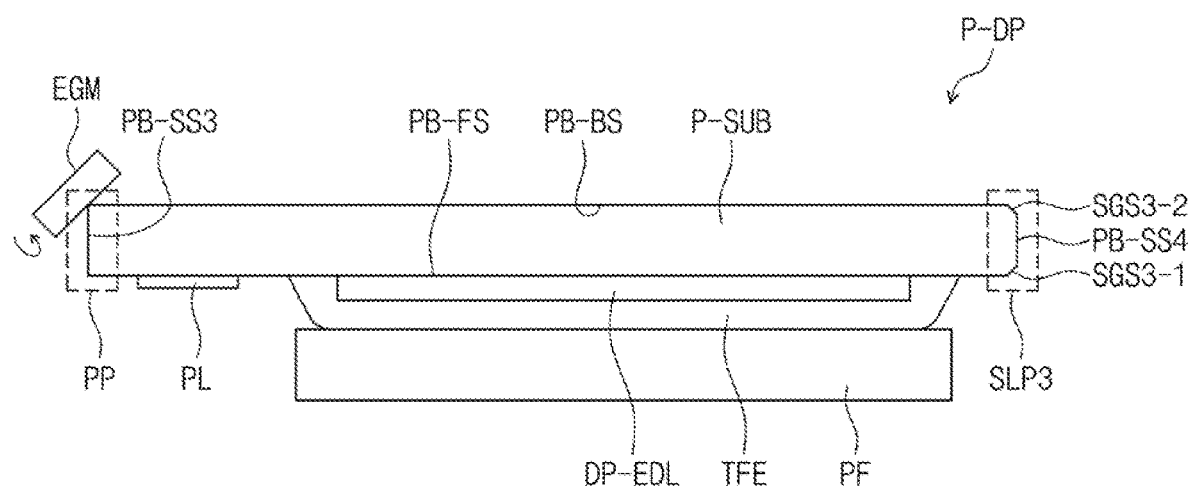
FIGS. 13A to 13C illustrate a grinding process for a pad portion according to an exemplary embodiment of the present disclosure.
Figure 13B:
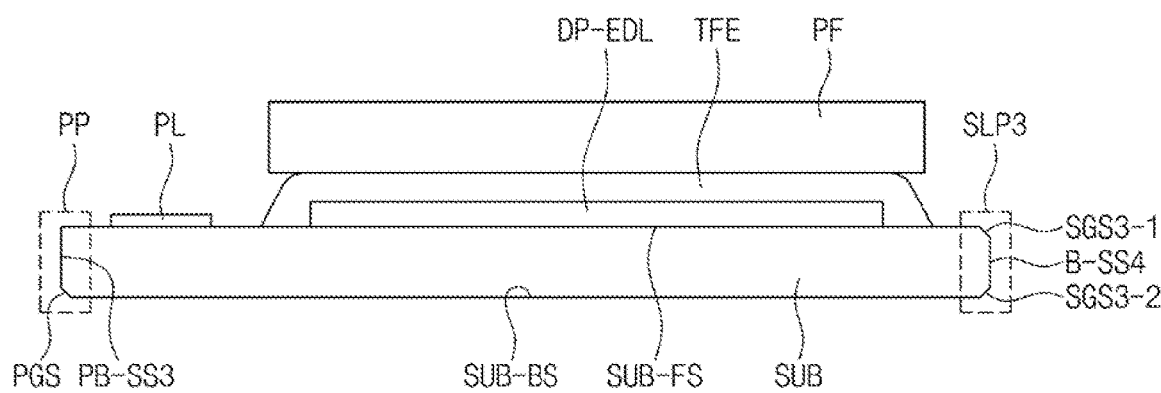
Figure 13C:
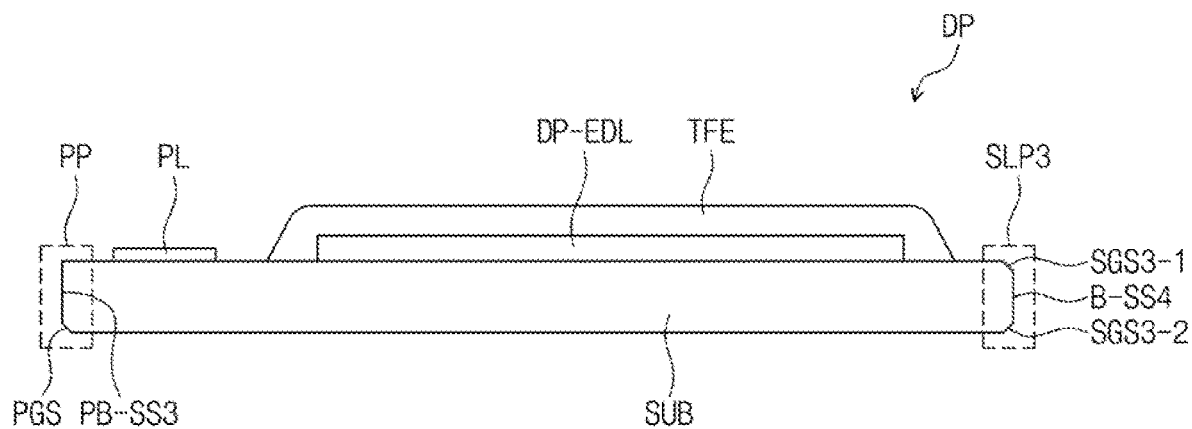

FIGS. 11A to 11C are illustrate a grinding process for the straight line-shaped portion, FIGS. 12A and 12B illustrate a grinding process for the shape processing portion, and FIGS. 13A to 13C illustrate a grinding process for the pad portion.

Referring to FIG. 11A, according to an embodiment, the preliminary base substrate P-SUB includes a front surface PB-FS on which the light emitting element layer DP-EDL and the encapsulation layer TFE are disposed, a rear surface PB-BS opposite to the front surface PB-FS, and side surfaces that connect the front surface PB-FS and the rear surface PB-BS. According to an embodiment of the present disclosure, the preliminary base substrate P-SUB includes first to fourth side surfaces. The first to fourth side surfaces of the preliminary base substrate P-SUB correspond to the first to fourth side surfaces SS1 to SS4 of the display panel DP shown in FIG. 2.

FIGS. 11A to 11C illustrate a process according to an embodiment in which the straight-line-shaped portion is ground by an edge grinding process, however, embodiments of the present disclosure should not be limited thereto. That is, in other embodiments, the straight-line-shaped portion is ground by a CNC grinding process.

Referring to FIG. 11A, according to an embodiment, an edge grinder EGM is disposed on a front surface edge of a second side surface PB-SS2 of the preliminary base substrate P-SUB. The edge grinder EGM is disposed at the front surface edge where the front surface PB-FS and the second side surface PB-SS2 of the preliminary base substrate P-SUB meet. The edge grinder EGM includes a rotational shaft and a grinding wheel that rotates about the rotational shaft. The grinding wheel is rotated by the rotational shaft and grinds the front surface edge of the straight-line-shaped portion. In a present exemplary embodiment, a rotational speed of the rotational shaft is about 4,000 RPM. The edge grinder EGM grinds the front surface edge of the straight-line-shaped portion at the second side surface PB-SS2 while moving along the front surface edge of the straight-line-shaped portion at the second side surface PB-SS2. In addition, the edge grinder EGM grinds other front surface edges of a straight-line-shaped portion at other side surfaces of the preliminary base substrate P-SUB while moving in addition to the front surface edge of the straight-line-shaped portion at the second side surface PB-SS2. A moving speed, i.e., a grinding speed, of the edge grinder EGM is about 50 mm/s.

According to an embodiment, after the front surface edge of the straight-line-shaped portion is ground, the preliminary display panel P-DP is turned upside down as shown in FIG. 11B. Then, the edge grinder EGM is disposed on a rear surface edge of the preliminary base substrate P-SUB. That is, the edge grinder EGM is disposed at the rear surface edge where the rear surface PB-BS and a first side surface PB-SS1 of the preliminary base substrate P-SUB meet.

According to an embodiment, the edge grinder EGM grinds the rear surface edge of the straight-line-shaped portion while being rotated. The edge grinder EGM grinds the rear surface edge of the straight-line-shaped portion at the second side surface PB-SS1 while moving along the front surface edge of the straight-line-shaped portion at the second side surface PB-SS1. In addition, the edge grinder EGM grinds other rear surface edges of a straight-line-shaped portion at other side surfaces of the preliminary base substrate P-SUB while moving in addition to the rear surface edge of the straight-line-shaped portion at the first side surface PB-SS1.

Accordingly, according to an embodiment, the first and second side surfaces PB-SS1 and PB-SS2 of the preliminary base substrate P-SUB are ground by the edge grinding process as shown in FIG. 11C, and thus a plurality of straight-line grind surfaces are formed in the first and second straight-line-shaped portions SLP1 and SLP2. In detail, the first straight-line-shaped portion SLP1 includes the first and second straight-line grind surfaces SGS1-1 and SGS1-2, and the second straight-line-shaped portion SLP2 includes the third and fourth straight-line grind surfaces SGS2-1 and SGS2-2. In an embodiment of the present disclosure, the first, second, third, and fourth straight-line grind surfaces SGS1-1, SGS1-2, SGS2-1, and SGS2-2 have a width of from about 10 micrometers to about 45 micrometers.

As described above, according to an embodiment, when a grinding process for the straight-line-shaped portion is completed, a grinding process for the shape processing portion or the pad portion can be carried out.

FIGS. 12A and 12B illustrate a process according to an embodiment in which the shape processing portion SMP1 to SMP4, shown in FIG. 2, is ground through the CNC grinding process. In the present exemplary embodiment, the shape processing portion SMP1 to SMP4 corresponds to the four corners of the display panel DP, shown in FIG. 2, which are processed to have a curved surface.

According to an embodiment, FIGS. 12A and 12B are views looking toward the straight-line-shaped portion SLP3 and shows shape processing portions SMP3 and SMP4. Referring to FIG. 12A, a CNC device is disposed at a fourth curved surface PB-CS4 of the preliminary base substrate P-SUB. The CNC device includes a plurality of CNC tools CT. Each CNC tool CT includes inclination surfaces spaced apart from each other by a predetermined distance. Each CNC tool CT includes a space defined by the inclination surfaces therein. When the fourth curved surface PB-CS4 of the preliminary base substrate P-SUB enters the space, the CNC tool CT substantially simultaneously grinds the front surface edge and the rear surface edge of the fourth curved surface PB-CS4 while rotating and moving at a predetermined speed.

According to an embodiment, a rotational speed of the CNC tool CT is about 25,000 RPM, and a moving speed is about 9 mm/s. The CNC tool CT substantially simultaneously grinds the front surface edge and the rear surface edge of the shape processing portion while rotating and moving. Similarly, the CNC tool CT grind the other curved surfaces, such as a third curved surface PB-CS3, of the curved-surface-shaped portion SMP3 disposed at other corners of the preliminary base substrate P-SUB as well as the curved-surface-shaped portion SMP4 of the second curved surface.

Therefore, according to an embodiment, the fourth and third curved surfaces PB-CS4 and PB-CS3 of the preliminary base substrate P-SUB are ground by a CNC grinding process as shown in FIG. 12B, and thus a plurality of curved-line grind surfaces are formed in the fourth and third curved-surface-shaped portions SMP4 and SMP3. In detail, the fourth curved-surface-shaped portion SMP4 includes the third and fourth curved-line grind surfaces CGS3 and CGS4, and the third curved-surface-shaped portion SMP3 includes the first and second curved-line grind surfaces CGS1 and CGS2. In an embodiment of the present disclosure, the first to fourth curved-line grind surfaces CGS1 to CGS4 have a width of from about 20 micrometers to about 100 micrometers.

In another embodiment of the present disclosure, when the straight-line-shaped portion is ground by a CNC grinding process rather than the edge grinding process, the straight-line-shaped portion and the shape processing portion are substantially simultaneously ground by the CNC grinding process.

According to an embodiment, when the grinding process for the shape processing portion is completed, a grinding process for the pad portion can be carried out.

According to an embodiment, when the straight-line-shaped portion is ground by an edge grinding process as shown in FIGS. 11A to 11C, the pad portion PP can be ground with the straight-line-shaped portion by the edge grinding process used to grind the straight-line-shaped portion.

Referring to FIG. 13A, according to an embodiment, a fourth side surface PB-SS4 of the preliminary base substrate P-SUB is ground by an edge grinding process, and thus a plurality of straight-line grind surfaces formed in the third straight-line-shaped portion SLP3. In detail, the third straight-line-shaped portion SLP3 includes fifth and sixth straight-line grind surfaces SGS3-1 and SGS3-2.

According to an embodiment, the preliminary display panel P-DP is turned upside down for the grinding process of the pad portion PP, and the edge grinder EGM is disposed at the rear surface edge of the pad portion PP. The edge grinder EGM is disposed at the rear surface edge where the rear surface PB-BS and the third side surface PB-SS3 of the preliminary base substrate P-SUB meet. The edge grinder EGM rotates the grinding wheel using the rotational shaft to grind the rear surface edge of the pad portion PP. The edge grinder EGM grinds the rear surface edge of the pad portion PP at the third side surface PB-SS3 while moving along the rear surface edge of the pad portion PP at the third side surface PB-SS3. In the present exemplary embodiment, a rotational speed of the rotational shaft is about 4,000 RPM, and a moving speed of the edge grinder EGM is about 50 mm/s.

According to an embodiment, as shown in FIG. 13B, the third side surface PB-SS3 of the preliminary base substrate P-SUB is ground by the edge grinding process, and thus the pad grinding surface PGS if formed in the pad portion PP. Thus, the base substrate SUB on which the grinding process is performed is completed.

Then, when the protective film PF is removed from the encapsulation layer TFE, the display panel DP is completed as shown in FIG. 13C.

Figure 14:
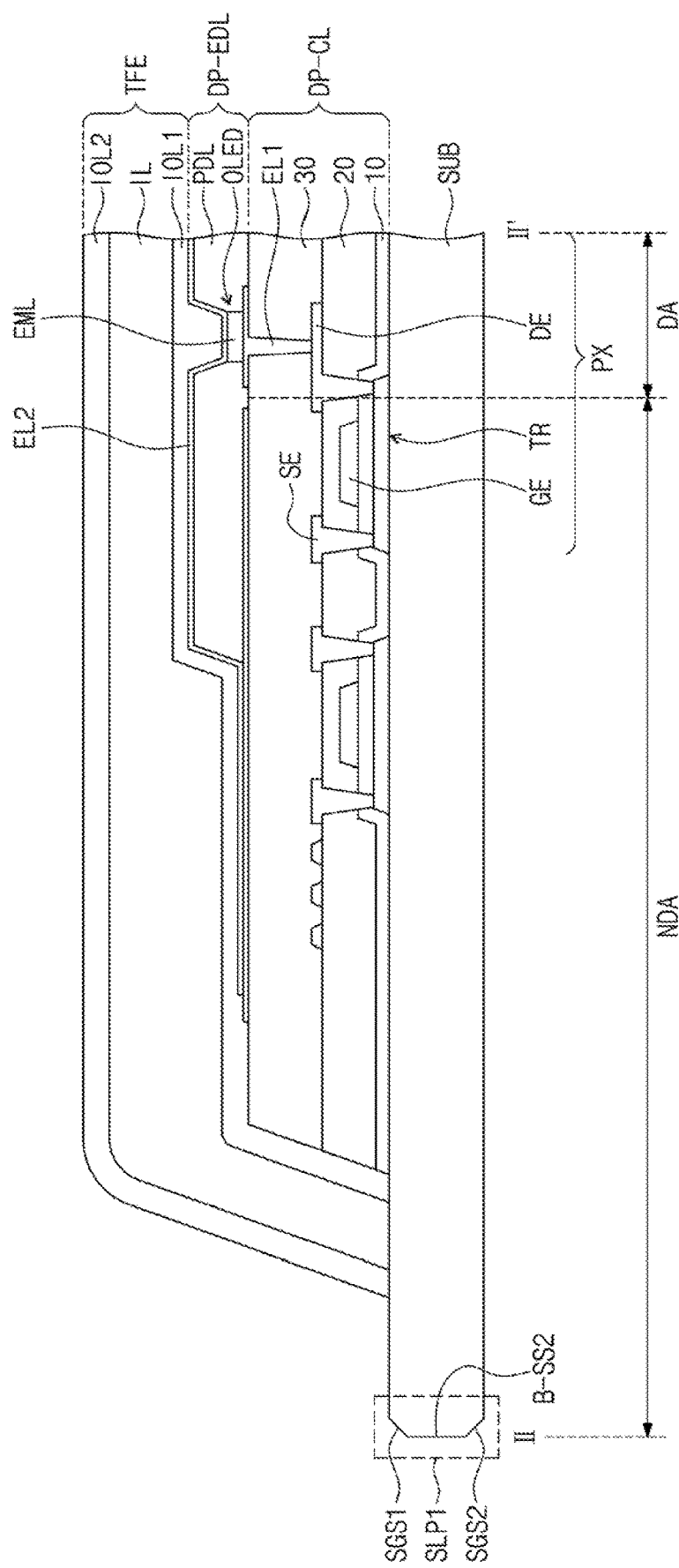
FIG. 14 is an enlarged view of a portion A3 in FIG. 3.

FIG. 14 is an enlarged view of a portion A3 in FIG. 3.

Referring to FIG. 14, according to an embodiment, the circuit element layer DP-CL, the light emitting element layer DP-EDL, and the encapsulation layer TFE are sequentially stacked on the base substrate SUB.

According to an embodiment, the circuit element layer DP-CL includes at least one inorganic layer, at least one organic layer, and a circuit element. The circuit element layer DP-CL includes a first intermediate inorganic layer 10, a second intermediate inorganic layer 20, and an intermediate organic layer 30.

According to an embodiment, the inorganic layers include one or more of silicon nitride, silicon oxynitride, or silicon oxide. The organic layer includes at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, or a perylene-based resin.

According to an embodiment, the pixel PX includes a plurality of transistors and an organic light emitting diode OLED. The transistors are disposed on the circuit element layer DP-CL. Of the transistors, a transistor TR connected to the organic light emitting diode OLED includes conductive patterns or semiconductor patterns. In detail, the transistor TR includes a gate electrode GE, a source electrode SE, and a drain electrode DE. The transistor TR further includes a semiconductor pattern. The semiconductor pattern includes one of amorphous silicon, polysilicon, or a metal oxide semiconductor.

According to an embodiment, the first intermediate inorganic layer 10 is disposed on the semiconductor pattern. The gate electrode GE of the transistor TR is disposed on the first intermediate inorganic layer 10. The second intermediate inorganic layer 20 is disposed on the first intermediate inorganic layer 10 and covers the gate electrode GE. The source electrode SE and the drain electrode DE are disposed on the second intermediate inorganic layer 20.

According to an embodiment, the intermediate organic layer 30 is disposed on the second intermediate inorganic layer 20 and covers the source electrode SE and the drain electrode DE. The intermediate organic layer 30 provides a flat upper surface that is opposite to the second intermediate inorganic layer 20.

According to an embodiment, the light emitting element layer DP-EDL is disposed on the flat upper surface of the intermediate organic layer 30. The light emitting element layer DP-EDL includes a pixel definition layer PDL and an organic light emitting diode OLED. The pixel definition layer PDL includes a same organic material as the intermediate organic layer 30. A first electrode EL1 is disposed on the intermediate organic layer 30. The first electrode EL1 is connected to the drain electrode DE via a through hole that penetrates the intermediate organic layer 30. The pixel definition layer PDL exposes at least a portion of the first electrode EL1.

According to an embodiment, a light emitting layer EML is disposed on the first electrode EL1. The light emitting layer EML is formed in each pixel PX after being patterned into a plurality of portions. The light emitting layer EML may include an organic material or an inorganic material. In a present exemplary embodiment, a patterned light emitting layer EML is shown as a representative example, however, embodiments are not limited thereto, and in other embodiments, the light emitting layer EML is commonly disposed over the pixels PX. In addition, the light emitting layer EML may have a multi-layer structure.

According to an embodiment, a second electrode EL2 is disposed on the light emitting layer EML. The second electrode EL2 is commonly disposed over the pixels PX.

According to an embodiment, the encapsulation layer TFE is disposed on the second electrode EL2. The encapsulation layer TFE is commonly disposed over the pixels PX. In a present exemplary embodiment, the encapsulation layer TFE directly covers the second electrode EL2.

According to an embodiment, the encapsulation layer TFE includes a first inorganic layer IOL1, an organic layer IL, and a second inorganic layer IOL2, which are sequentially stacked on each other. The organic layer IL is disposed between the first inorganic layer IOL1 and the second inorganic layer IOL2. The first inorganic layer IOL1 and the second inorganic layer IOL2 are formed by depositing an inorganic material, and the organic layer IL is formed by depositing, printing, or coating an organic material.

According to an embodiment, the first inorganic layer IOL1 and the second inorganic layer IOL2 protect the organic light emitting diodes OLED from moisture and oxygen, and the organic layer IL protects the organic light emitting diodes OLED from foreign substances, such as dust particles. The first inorganic layer IOL1 and the second inorganic layer IOL2 include at least one of silicon nitride, silicon oxynitride, silicon oxide, titanium oxide, or aluminum oxide. The organic layer IL includes a polymer, such as an acrylic-based organic layer, however, this is merely exemplary and embodiments are not limited thereto.

According to an embodiment, FIG. 14 shows that the encapsulation layer TFE includes two inorganic layers IOL1 and IOL2 and one organic layer IL as a representative example, however, embodiments are not limited thereto. For example, in other embodiments, the encapsulation layer TFE includes three inorganic layers and two organic layers, and in this case, the encapsulation layer TFE has a structure in which the inorganic layers and the organic layers are alternately stacked on each other.

Figure 15:
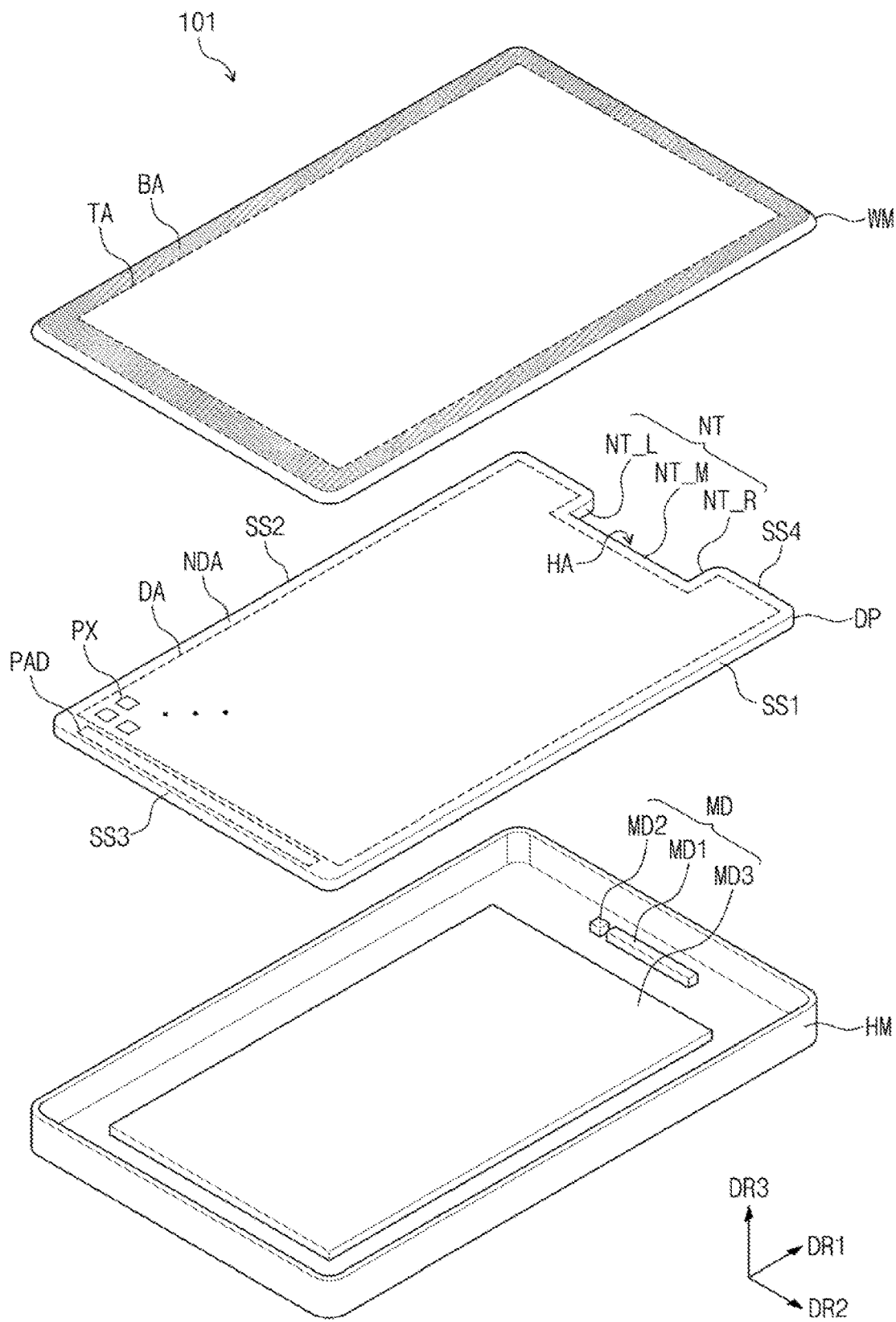
FIG. 15 is an exploded perspective view of a display device according to an exemplary embodiment of the present disclosure.
Figure 16:
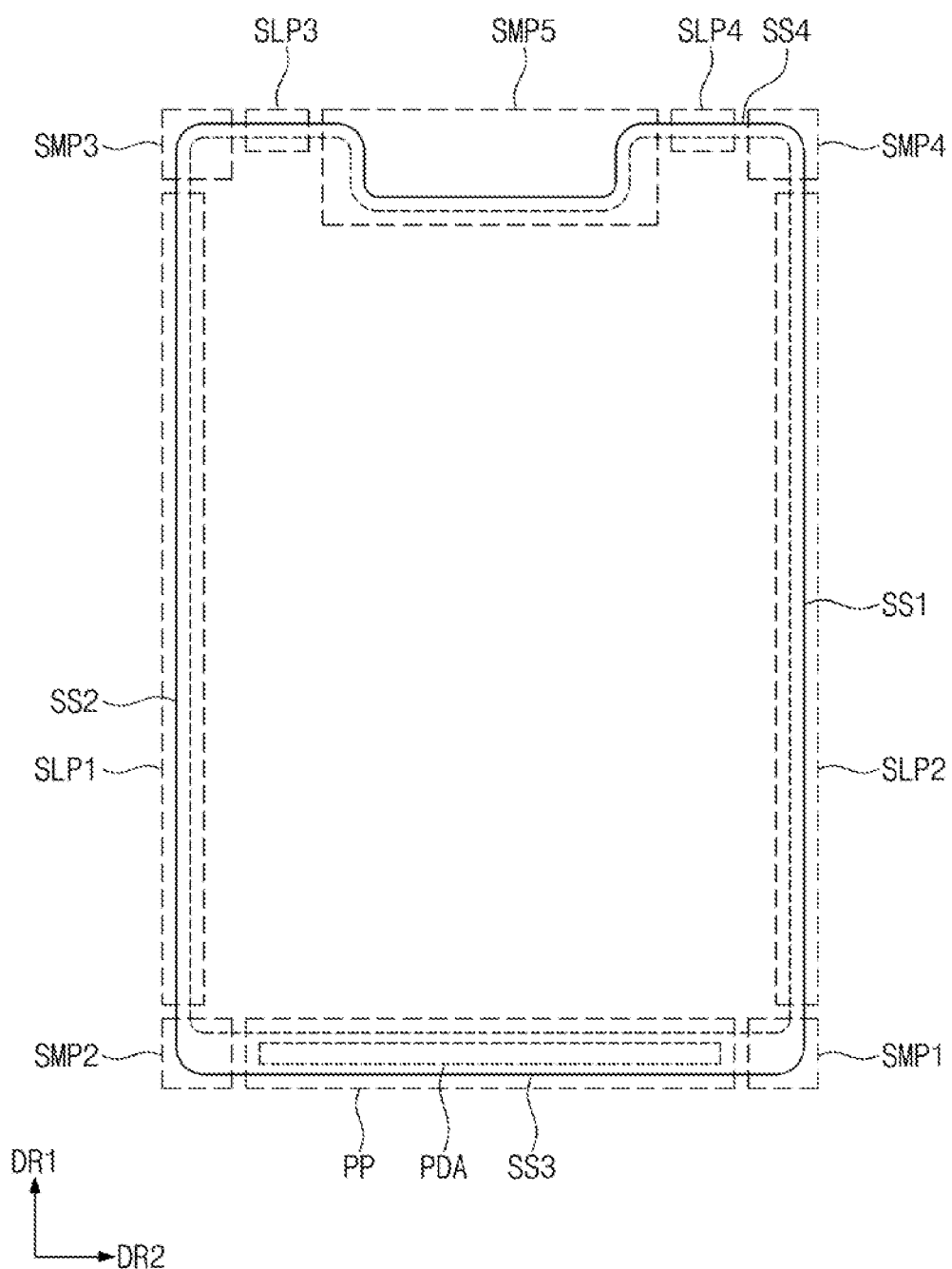
FIG. 16 is a plan view of a display panel shown in FIG. 15.
Figure 17:
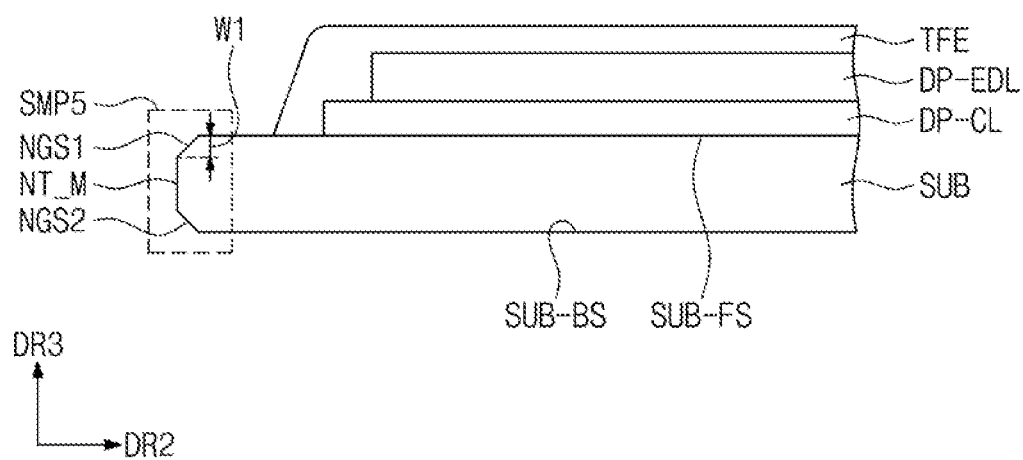
FIG. 17 is a cross-sectional view of a notch-shaped portion in FIG. 16.

FIG. 15 is an exploded perspective view of a display device according to an exemplary embodiment of the present disclosure, FIG. 16 is a plan view of a display panel shown in FIG. 15, and FIG. 17 is a cross-sectional view of a notch-shaped portion in FIG. 16.

As shown in FIGS. 15 and 16, according to an embodiment, the display device 101 includes a display panel DP, an external module MD, a housing HM, and a window WM. The external module MD includes a plurality of modules MD1, MD2, and MD3.

According to an embodiment, the display panel DP includes a display area DA that displays an image in response to electrical signals and a non-display area NDA adjacent to the display area DA. The display panel DP includes a plurality of pixels PX. The pixels PX are disposed in the display area DA.

According to an embodiment, the display panel DP includes at least one notch portion NT. That is, the display panel DP includes at least four sides when viewed in a plan view, and the notch portion NT is a portion of one side of the four sides that is recessed toward a center of the display panel DP.

According to an embodiment, the notch portion NT includes a first processing surface NT_L, a second processing surface NT_R, and a third processing surface NT_M. Each of the first processing surface NT_L and the second processing surface NT_R extends in the first direction DR1 and the third direction DR3. The first processing surface NT_L and the second processing surface NT_R face each other in the second direction DR2. The third processing surface NT_M extends in the second direction DR2 and the third direction and connects the first processing surface NT_L and the second processing surface NT_R.

According to an embodiment, the external module MD includes a sound module MD1, an optical module MD2, and a power module MD3. The sound module MD1 may be a sound output module that converts an electrical signal into a sound signal or a sound input module that receives an external sound signal and converts the external sound signal into an electrical signal.

According to an embodiment, the optical module MD2 may be a light receiving module that receives an external light signal, such as an infrared signal, and converts the external light signal into an electrical signal, a light emitting module that receives an electrical signal and converts the electrical signal into a light signal, such as an infrared signal or visible light, or a camera module that acquires images of external subjects.

According to an embodiment, the power module MD3 supplies power necessary for an overall operation of the display device 101. The sound module MD1, the optical module MD2, and the display panel DP receive power from the power module MD3. The power module MD3 includes a conventional battery module.

According to an embodiment, at least one of the external modules MD is disposed in a recessed area HA surrounded by the notch portion NT. For example, the sound module MD1 and the optical module MD2 are disposed in the recessed area HA surrounded by the notch portion NT. Since the display panel DP according to an exemplary embodiment of the present disclosure includes the notch portion NT, the external module MD and the display panel DP can be stably accommodated in the housing HM without increasing the size of the housing HM. Therefore, the display device 101 has a narrow bezel area.

According to an embodiment, the housing HM provides a predetermined internal space. The display panel DP and the external module MD are accommodated in the internal space of the housing HM. As described above, as at least a portion of the external module MD is accommodated in the notch portion NT, the size of the housing HM can be prevented from increasing.

According to an embodiment, the window WM is coupled to the housing HM to form the internal space. The window WM and the housing HM define an appearance of the display device 101.

In addition, in a present exemplary embodiment, the window WM includes a transmission area TA that overlaps the recessed area HA surrounded by the notch portion NT. Accordingly, the modules MD1 and MD2 disposed in the recessed area HA can be seen from the outside through the transmission area TA.

According to an embodiment, when the display panel DP includes the notch portion NT, the display panel DP has an atypical shape.

According to an embodiment, the edge of the display panel DP includes straight-line-shaped portions SLP1 to SLP4 and shape processing portions SMP1 to SMP5. The straight-line-shaped portions SLP1 to SLP4 and the shape processing portions SMP1 to SMP5 are defined based on shapes of the edge of the display panel DP. That is, the edge of the display panel DP in the straight-line-shaped portions SLP1 to SLP4 has a straight line shape, and the edge of the display panel DP in the shape processing portions SMP1 to SMP5 has a curved line shape or a shape that is concave or convex with respect to the side surfaces of the display panel DP.

According to an embodiment of the present disclosure, the straight-line-shaped portions SLP1 to SLP4 include first to fourth straight-line-shaped portions SLP1 to SLP4. The first to fourth straight-line-shaped portions SLP1 to SLP4 correspond to the first, second, and fourth side surfaces SS1, SS2, and SS4. That is, the first straight-line-shaped portion SLP1 overlaps the second side surface SS2, and the second straight-line-shaped portion SLP2 overlaps the first side surface SS1. The third and fourth straight-line-shaped portions SLP3 and SLP4 overlap the fourth side surface SS4.

According to an embodiment of the present disclosure, the shape processing portions SMP1 to SMP5 include first to fourth curved-surface-shaped portions SMP1 to SMP4 and a notch-shaped portion SMP5. The notch-shaped portion SMP5 has a recessed fourth side surface and disposed between the third and fourth straight-line-shaped portions SLP3 and SLP4.

According to an embodiment, the edge of the display panel DP further includes a pad portion PP adjacent to a pad area PDA. The pad portion PP overlaps the third side surface SS3 and is disposed between the first and second curved-surface-shaped portions SMP1 and SMP2.

Referring to FIGS. 16 and 17, according to an embodiment, the notch-shaped portion SMP5 includes first and second notch grinding surfaces NGS1 and NGS2 formed in the notch portion NT. In detail, the first notch grinding surface NGS1 is formed between the third processing surface NT_M and a front surface SUB-FS of a base substrate SUB, and the second notch grinding surface NGS2 is formed between the third processing surface NT_M and a rear surface SUB-BS of the base substrate SUB. The first and second notch grinding surfaces NGS1 and NGS2 are formed not only on the third processing surface NT_M but also on the first and second processing surfaces NT_L and NT_R, shown in FIG. 15.

According to an embodiment, each of the first and second notch grinding surfaces NGS1 and NGS2 has an inclined surface. Each of the first and second notch grinding surfaces NGS1 and NGS2 has a first width W1 in the third, thickness direction DR3 of the display panel DP. According to an embodiment of the present disclosure, the first width W1 has a value within a range of from about 20 micrometers to about 100 micrometers.

As described above, according to an embodiment, as the grinding surfaces are formed in the notch portion NT, a strength of the notch portion of the base substrate SUB is reinforced. In particular, the first and second notch grinding surfaces NGS1 and NGS2 are formed through a grinding process. According to an embodiment of the present disclosure, the notch-shaped portion SMP5 is formed through a CNC grinding process.

In addition, according to an embodiment, as grinding processes are performed on the base substrate SUB in the shape-processed portions in various ways, the strength of the edge portions of the display panel DP are reinforced.

Although exemplary embodiments of the present disclosure have been described, it is understood that embodiments of the present disclosure should not be limited to these exemplary embodiments but various changes and modifications can be made by one ordinary skilled in the art within the spirit and scope of the present disclosure as hereinafter claimed. Therefore, the disclosed subject matter should not be limited to exemplary embodiments described herein, and the scope of the present inventive concept shall be determined according to the attached claims.

What is claimed is:

1. A display panel, comprising:
   a base substrate that includes a front surface and a rear surface, wherein each of the front surface and rear surface is parallel to a plane defined by a first direction and a second direction wherein the second direction crosses the first direction;
   a light emitting element layer disposed on the front surface of the base substrate; and
   an encapsulation layer that covers the light emitting element layer,
   wherein an edge of the base substrate includes:
      a first straight portion that extends in the first direction and a second straight portion that extends in the second direction, wherein each of the first straight portion and the second straight portion extends in a straight line; and
      a curved-shaped portion that connects the first straight portion and the second straight portion, wherein the curved shaped portion includes at least one curved-surface-shaped portion that has a curved shape, wherein the at least one curved-surface-shaped portion includes:
         a first curved-line surface formed in art edge of the front surface of the base substrate, wherein the first curved-line surface connects the front surface to a flat side surface of the base substrate; and
         a second curved-line surface formed in an edge of the rear surface of the base substrate, wherein the second curved-line surface connects the flat side surface to the rear surface of the base substrate.

2. The display panel of claim 1, wherein
   each of the first and second straight portions includes an inclined flat surface formed in the edge of the front surface and connects the front surface to the flat side surface of the base substrate, or of the rear surface and connects the flat side surface to the rear surface of the base substrate, and
   the inclined flat surface has a width in a third direction normal to the plane defined by the first direction and the second direction that is equal to or less than that of the first and second curved-line surface of the curved shaped portion.

3. The display panel of claim 1 further comprising
   a plurality of pads disposed on the base substrate,
   wherein the edge of the base substrate further includes a pad portion adjacent to the plurality of pads, and the pad portion comprises a pad surface formed in the edge of the rear surface of the base substrate,
   wherein the pad surface connects the side surface of the base substrate to the rear surface of the substrate.

4. The display panel of claim 3, wherein the pad surface has a width in a third direction normal to the plane defined by the first direction and the second direction that is less than that of the first and second curved-line surfaces of the curved-shaped portion.

* * * * *